US012787512B2

(12) United States Patent
Kitazawa

(10) Patent No.: US 12,787,512 B2
(45) Date of Patent: Nov. 3, 2026

(54) LIGHT-EMITTING DEVICE AND DISPLAY APPARATUS

(71) Applicant: Sharp Display Technology Corporation, Kameyama City (JP)

(72) Inventor: Tazuko Kitazawa, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 306 days.

(21) Appl. No.: 18/721,877

(22) PCT Filed: Feb. 14, 2022

(86) PCT No.: PCT/JP2022/005671
§ 371 (c)(1),
(2) Date: Jun. 20, 2024

(87) PCT Pub. No.: WO2023/152968
PCT Pub. Date: Aug. 17, 2023

(65) Prior Publication Data

US 2025/0063862 A1 Feb. 20, 2025

(51) Int. Cl.
*H10H 20/851* (2025.01)
*H10H 20/832* (2025.01)
*H10H 20/833* (2025.01)
*H10W 90/00* (2026.01)

(52) U.S. Cl.
CPC ...... *H10H 20/8512* (2025.01); *H10H 20/833* (2025.01); *H10H 20/835* (2025.01); *H10W 90/00* (2026.01)

(58) Field of Classification Search
None
See application file for complete search history.

(56) References Cited

U.S. PATENT DOCUMENTS

2007/0159043 A1* 7/2007 Kubota .................. H10K 59/12 313/110
2013/0153748 A1* 6/2013 Suzuki ................. H04N 25/133 250/208.1
2016/0071910 A1* 3/2016 Sasaki .................. H10K 59/351 257/89
2017/0084877 A1* 3/2017 Lee .................... H10D 30/6723
(Continued)

FOREIGN PATENT DOCUMENTS

WO 2021/070236 A1 4/2021

*Primary Examiner* — Bilkis Jahan
(74) *Attorney, Agent, or Firm* — ScienBiziP, P.C.

(57) ABSTRACT

A pixel includes a first R subpixel having a reflective electrode disposed on a second display surface side and a first R light-emitting layer disposed on a first display surface side relative to the reflective electrode; a second R subpixel having a reflective electrodes disposed on the first display surface side and a second R light-emitting layer disposed on the second display surface side relative to the reflective electrode; a first G subpixel having a reflective electrode disposed on the second display surface side and a first G light-emitting layer disposed on the first display surface side relative to the reflective electrode; a second G subpixel having a reflective electrode disposed on the first display surface side and a second G light-emitting layer disposed on the second display surface side relative to the reflective electrode; and a B subpixel having a B light-emitting layer.

20 Claims, 22 Drawing Sheets

(56) References Cited

U.S. PATENT DOCUMENTS

| | | | | |
|---|---|---|---|---|
| 2017/0179206 | A1* | 6/2017 | Lee | G09G 3/3225 |
| 2020/0194705 | A1* | 6/2020 | Kim | H10K 50/131 |
| 2021/0151518 | A1* | 5/2021 | Park | H10K 50/131 |
| 2022/0115454 | A1* | 4/2022 | Ko | H10K 59/351 |
| 2022/0352481 | A1* | 11/2022 | Kitazawa | G09F 9/30 |

* cited by examiner

LIGHT-EMITTING DEVICE AND DISPLAY APPARATUS

TECHNICAL FIELD

The following disclosure relates to a light-emitting device and a display apparatus.

BACKGROUND ART

A light-emitting device of a transmissive type is disclosed in PTL 1. This light-emitting device is provided with, as subpixels, a red subpixel including a red light-emitting layer, a green subpixel including a green light-emitting layer, and a blue subpixel including a blue light-emitting layer arranged side-by-side, and includes an opaque region overlapping at least the entirety of the red subpixel and the green subpixel in a plan view and blocking background light, and a transparent region overlapping at least part of the blue subpixel in a plan view and transmitting the background light. According to PTL 1, there is provided a light-emitting device of a transmissive type that suppresses a change in white balance of a light-emitting face by background light while suppressing a decrease in a ratio of a light-emitting region to the entire light-emitting face.

CITATION LIST

Patent Literature

PTL 1: WO 2021/070236

SUMMARY

Technical Problem

The light-emitting device of PTL 1 is unable to display information on both surfaces of the light-emitting device. Meanwhile, when the background of each pixel is made transparent in order to cause a general light-emitting device to be a transmissive-type light-emitting device, since a subpixel that emits red light and a subpixel that emits green light include quantum dots, there arises a problem that each of the subpixels is excited by the background light and emits red or green light by photo luminescence (PL).

An object of an aspect of the disclosure is to provide a light-emitting device of a transmissive type that can display information on both surfaces thereof and does not perform unwanted PL light emission caused by background light.

Solution to Problem

To solve the above-described problem, a light-emitting device according to an aspect of the disclosure includes a pixel and is configured to display information on each of a first display surface and a second display surface on the opposite side to the first display surface. The pixel is at least provided with:

- a first subpixel that includes a first opaque layer disposed on the second display surface side and a first light-emitting layer disposed on the first display surface side relative to the first opaque layer and including a first quantum dot, and emits first color light having a longer wavelength than blue light at the first display surface side;
- a second subpixel that includes a second opaque layer disposed on the first display surface side and a second light-emitting layer disposed on the second display surface side relative to the second opaque layer and including a second quantum dot, and emits the first color light at the second display surface side;
- a third subpixel that includes a third opaque layer disposed on the second display surface side and a third light-emitting layer disposed on the first display surface side relative to the third opaque layer and including a third quantum dot, and emits second color light having a longer wavelength than blue light and being different from the first color light at the first display surface side;
- a fourth subpixel that includes a fourth opaque layer disposed on the first display surface side and a fourth light-emitting layer disposed on the second display surface side relative to the fourth opaque layer and including a fourth quantum dot, and emits the second color light at the first display surface side; and
- a fifth subpixel that includes a fifth light-emitting layer and emits the blue light at both the first display surface side and the second display surface side.

Advantageous Effects of Disclosure

According to an aspect of the disclosure, it is possible to provide a light-emitting device of a transmissive type that can display information on both surfaces thereof and does not perform unwanted PL light emission caused by background light.

DESCRIPTION OF EMBODIMENTS

First Embodiment

Configuration of Display Apparatus 1

Figure 1:
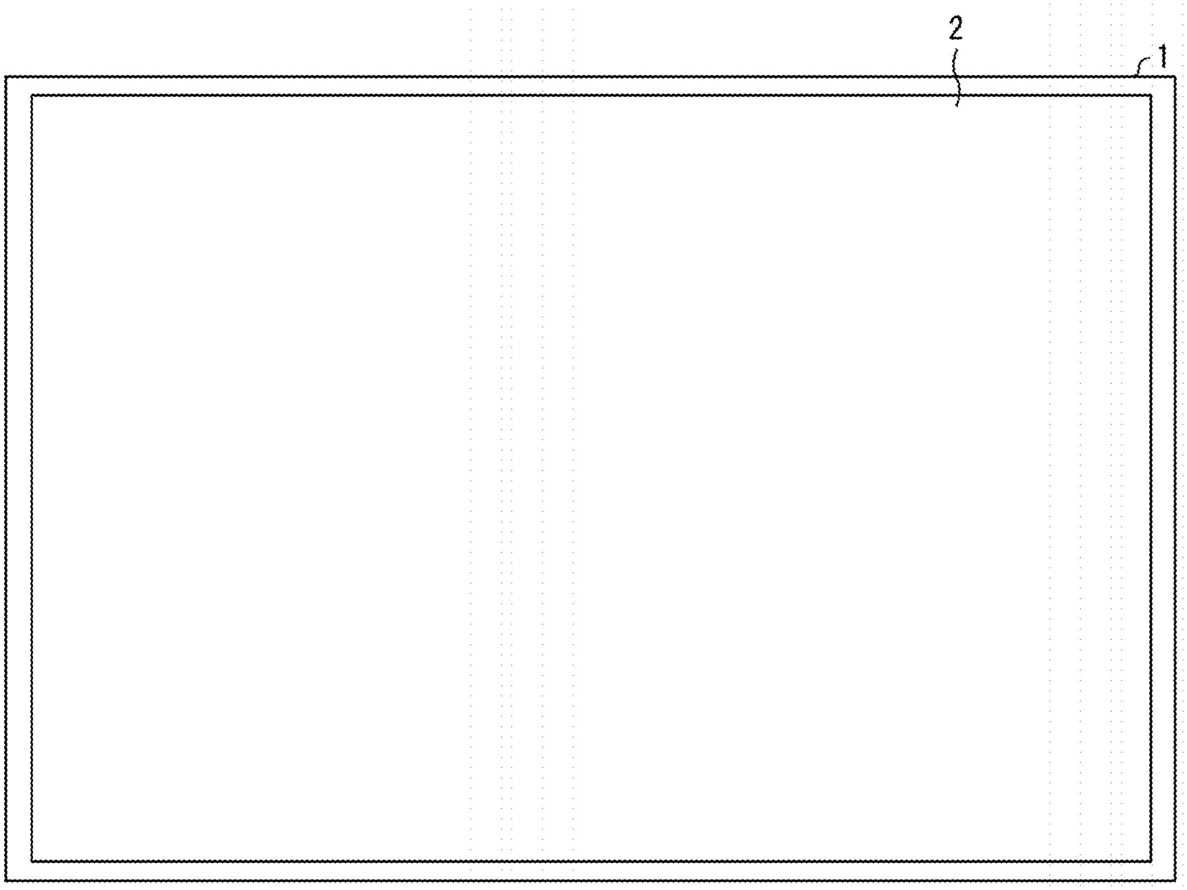
FIG. 1 is a front view illustrating a configuration of a display apparatus according to a first embodiment of the disclosure.
Figure 2:
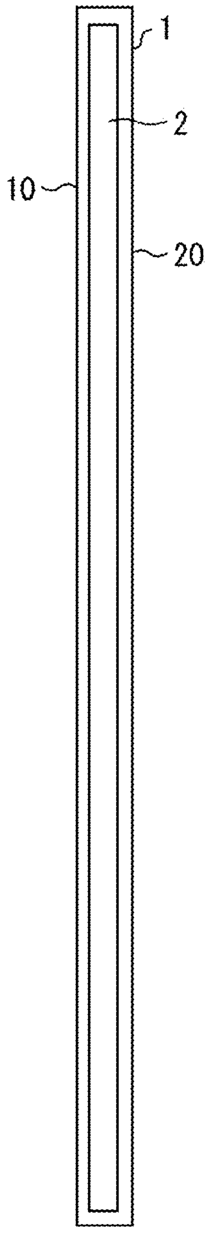
FIG. 2 is a side view illustrating a configuration of a display apparatus according to the first embodiment of the disclosure.

FIG. 1 is a front view illustrating a configuration of a display apparatus 1 according to a first embodiment of the disclosure. FIG. 2 is a side view illustrating the configuration of the display apparatus 1 according to the first embodiment of the disclosure. FIG. 1 illustrates a front view of the display apparatus 1, and FIG. 2 illustrates a side view of the display apparatus 1. As illustrated in the above-mentioned drawings, the display apparatus 1 includes at least a light-emitting device 2.

The light-emitting device 2 is a double-sided display device able to display information on both surfaces of the light-emitting device 2. Specifically, the light-emitting device 2 displays information on each of a display surface 10 (first display surface) of the light-emitting device 2 and a display surface 20 (second display surface) on the opposite side to the display surface 10 of the light-emitting device 2. The light-emitting device 2 is a transmissive-type light-emitting device. On the display surface 10, a user visually recognizes both the information displayed on the display surface 10 of the light-emitting device 2 and a real image present behind the display surface 20 of the light-emitting device 2 in a rear direction viewed from the user. The user can visually recognize the display information and the real image on the display surface 10 at the same time or at different timings. Further, the user visually recognizes, on the display surface 20, both the information displayed on the display surface 20 of the light-emitting device 2 and a real image present behind the display surface 10 of the light-emitting device 2. The user can visually recognize the display information and the real image on the display surface 20 at the same time or at different timings.

Configuration of Light-Emitting Device 2

Figure 3:
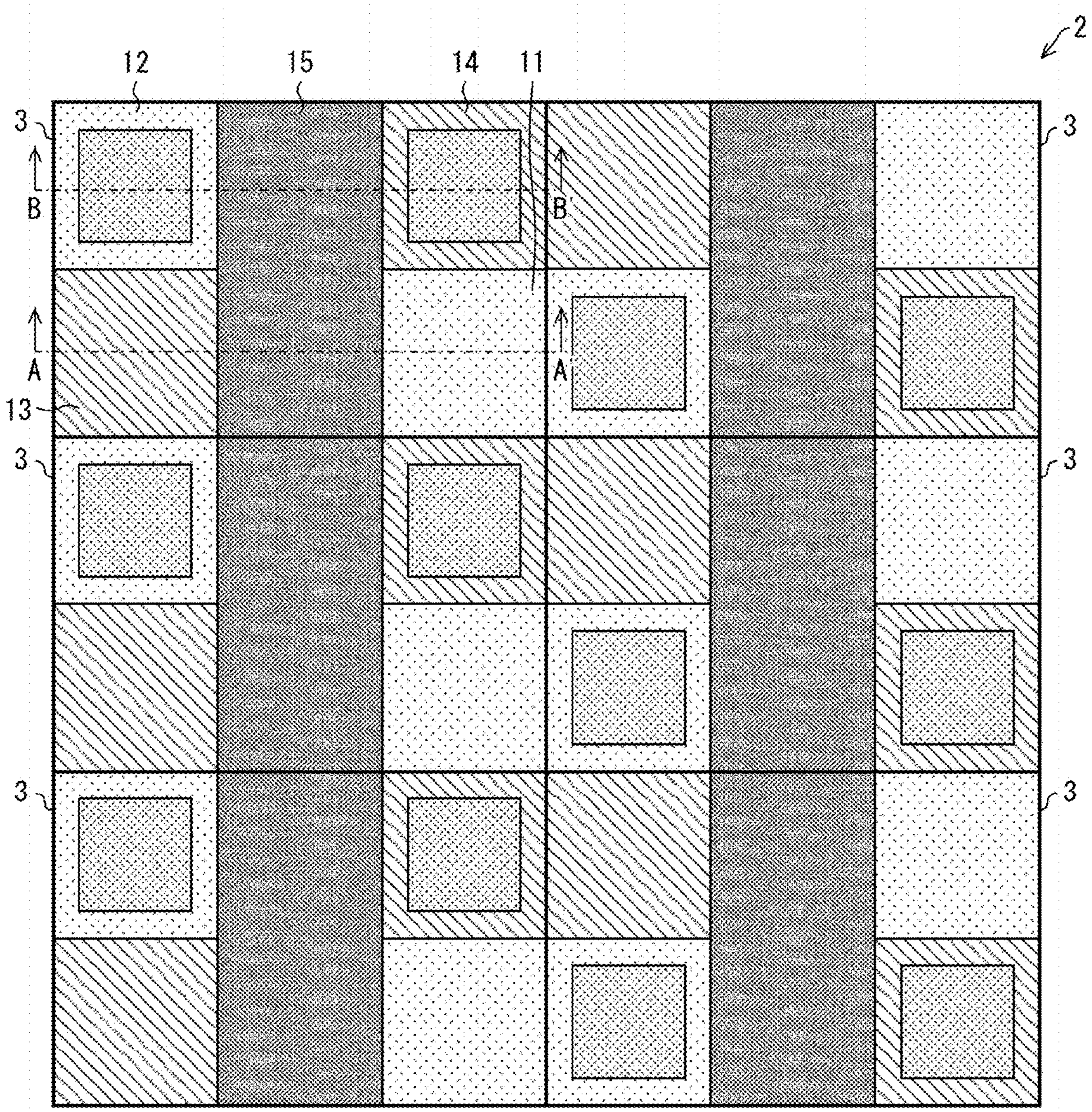
FIG. 3 is a diagram illustrating a configuration of each of pixels provided in a light-emitting device according to the first embodiment of the disclosure.

FIG. 3 is a diagram illustrating a configuration of each of pixels 3 provided in the light-emitting device 2 according to the first embodiment of the disclosure. As illustrated in FIG. 3, the light-emitting device 2 includes a plurality of pixels 3 disposed in a planar form. FIG. 3 illustrates only six pixels 3 among all the pixels 3 provided in the light-emitting device 2. In the present embodiment, each pixel 3 includes five different subpixels. Specifically, the pixel 3 includes a first R subpixel 11 (first subpixel), a second R subpixel 12 (second subpixel), a first G subpixel 13 (third subpixel), a second G subpixel 14 (fourth subpixel), and a B subpixel 15 (fifth subpixel).

In the pixel 3, the first R subpixel 11 is adjacent to subpixels other than another first R subpixel 11 and the first G subpixel 13. In an example of FIG. 3, the first R subpixel 11 is adjacent to the second G subpixel 14 and the B subpixel 15, and is adjacent to none of the second R subpixel 12 and the first G subpixel 13. In the present embodiment, "adjacency of subpixels" means that two different subpixels share at least part of a boundary line defining the pixel 3 or any of the subpixels.

In the pixel 3, the second R subpixel 12 is adjacent to subpixels other than another second R subpixel 12 and the second G subpixel 14. In the example of FIG. 3, the second R subpixel 12 is adjacent to the first G subpixel 13 and the B subpixel 15, and is adjacent to none of the first R subpixel 11 and the second G subpixel 14.

In the pixel 3, the first G subpixel 13 is adjacent to subpixels other than another first G subpixel 13 and the first R subpixel 11. In the example of FIG. 3, the first G subpixel 13 is adjacent to the second R subpixel 12 and the B subpixel 15, and is adjacent to none of the first R subpixel 11 and the second G subpixel 14.

In the pixel 3, the second G subpixel 14 is adjacent to subpixels other than another second G subpixel 14 and the first G subpixel 13. In the example of FIG. 3, the second G subpixel 14 is adjacent to the first R subpixel 11 and the B subpixel 15, and is adjacent to none of the second R subpixel 12 and the first G subpixel 13.

As illustrated in FIG. 3, the B subpixel 15 is adjacent to all of the first R subpixel 11, the second R subpixel 12, the first G subpixel 13, and the second G subpixel 14.

In the light-emitting device 2, the first R subpixel 11, the first G subpixel 13, and the B subpixel 15 are used for displaying red, green, and blue points on the display surface 10, respectively. On the other hand, the second R subpixel 12, the second G subpixel 14, and the B subpixel 15 are used for displaying red, green, and blue points on the display surface 20, respectively. As described above, the B subpixel 15 is used for displaying a blue point on the display surface 10 and also for displaying a blue point on the display surface 20.

The first R subpixel 11 emits red light (first color light) having a longer wavelength than blue light at the display surface 10 side of the light-emitting device 2. Blue light is, for example, light having a spectrum half value width of 50 nm or less and a peak wavelength of 420 nm to 480 nm. To put it another way, blue light is light having energy of 2.954 eV to 2.585 eV. Red light is, for example, light having a spectrum half value width of 50 nm or less and a peak wavelength of 600 nm to 650 nm. To put it another way, red light is light having energy of 2.068 eV to 1.909 eV. The second R subpixel 12 emits red light at the display surface 20 side of the light-emitting device 2. As described above, both the first R subpixel 11 and the second R subpixel 12 emit red light, but the light emission directions of these pieces of red light are opposite to each other.

The first G subpixel 13 emits green light (second color light) having a longer wavelength than blue light and being different from red light at the display surface 10 side of the light-emitting device 2. Green light is, for example, light having a spectrum half value width of 50 nm or less and a peak wavelength of 500 nm to 550 nm. To put it another way, green light is light having energy of 2.481 eV to 2.256 eV. The second G subpixel 14 emits green light at the display surface 20 side of the light-emitting device 2. As described above, both the first G subpixel 13 and the second G subpixel 14 emit green light, but the light emission directions of these pieces of green light are opposite to each other.

The B subpixel 15 emits blue light at both the display surface 10 side and the display surface 20 side of the light-emitting device 2. As described above, the B subpixel 15 emits blue light in two directions opposite to each other.

Configuration of Pixel 3

Figure 4:
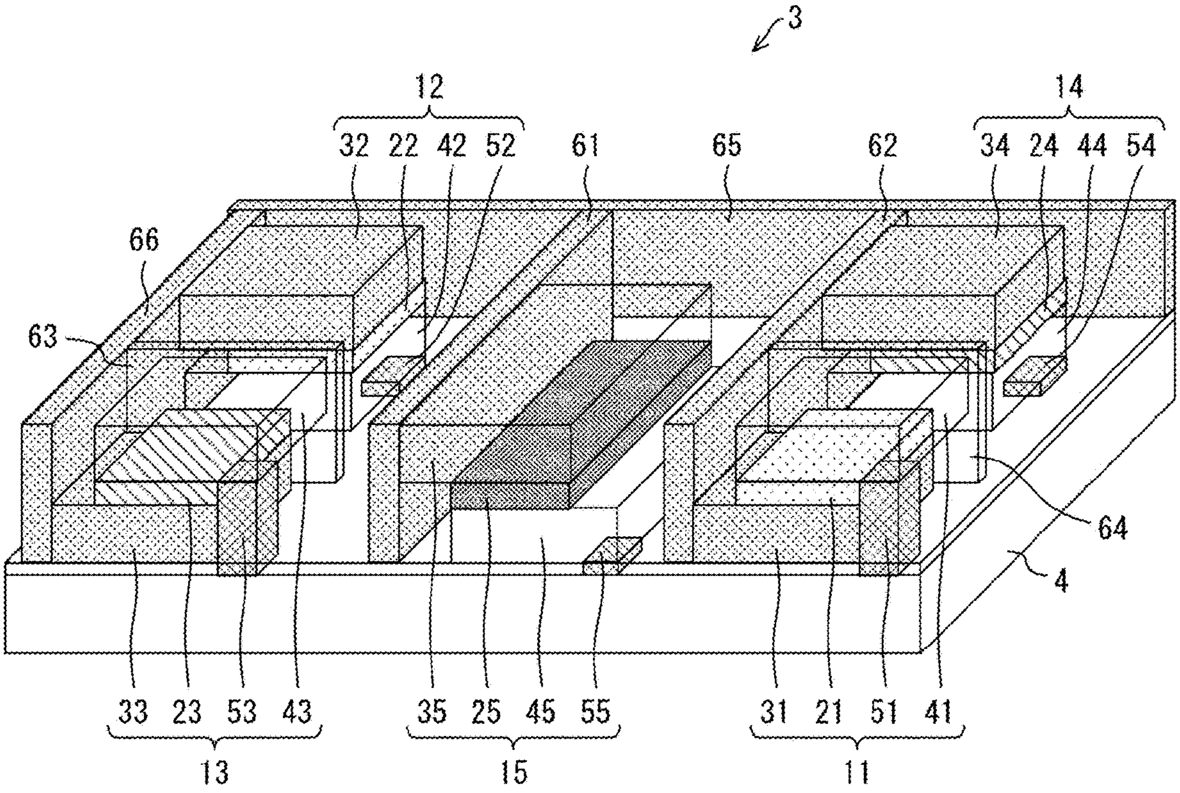
FIG. 4 is a bird's-eye view illustrating a configuration of an interior of a pixel according to the first embodiment of the disclosure.
Figure 5:
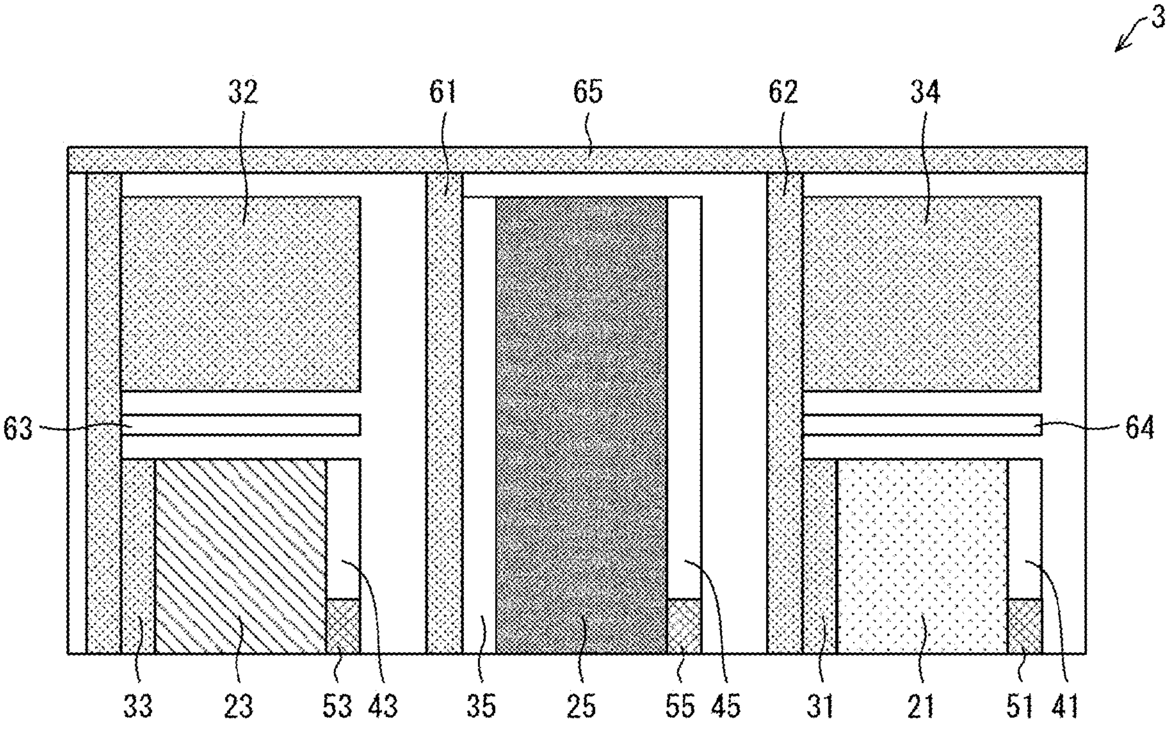
FIG. 5 is a top view illustrating a configuration of an interior of a pixel according to the first embodiment of the disclosure.
Figure 6:
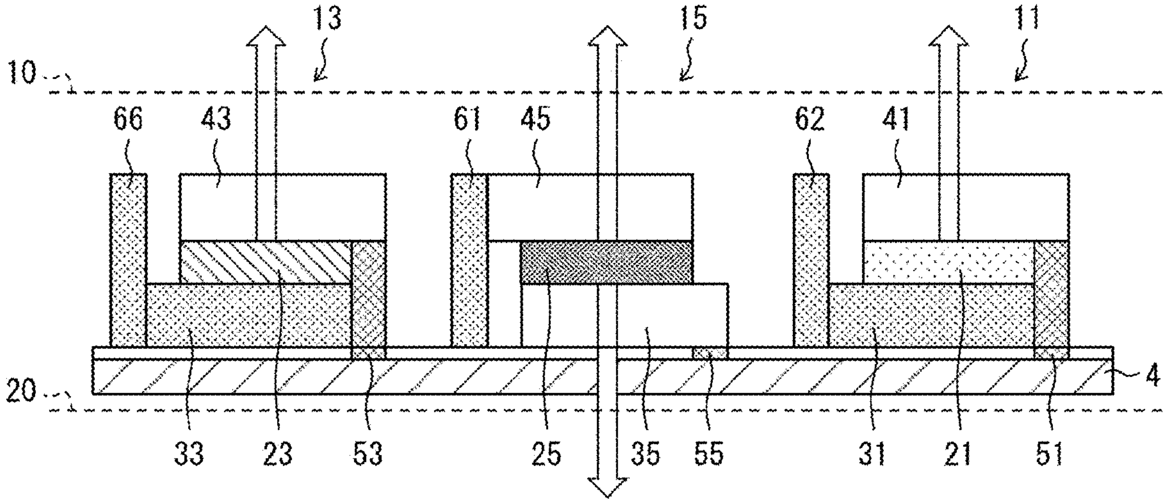
FIG. 6 is a cross-sectional view illustrating a cross section of a portion of the pixel taken along line A-A' indicated in FIG. 3.
Figure 7:
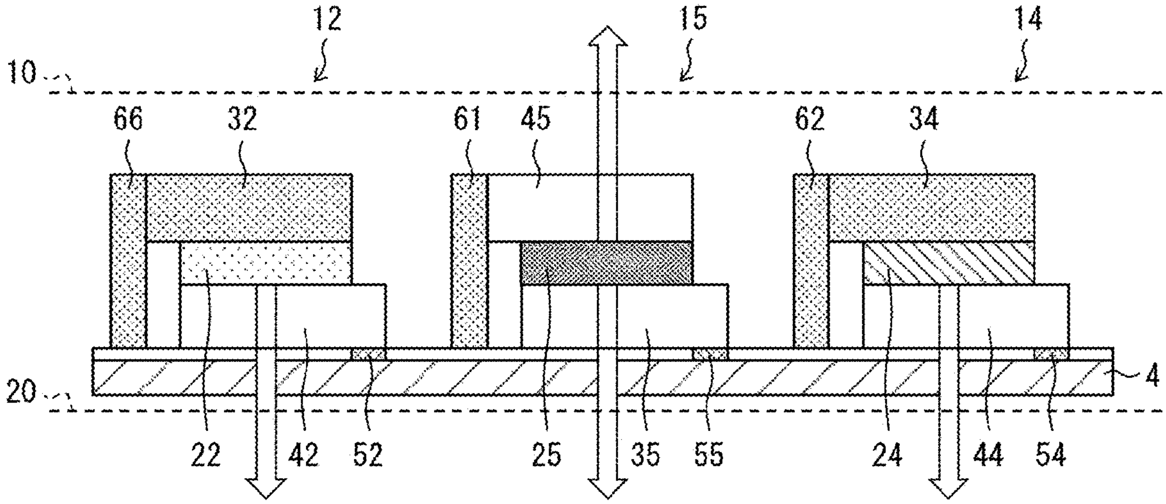
FIG. 7 is a cross-sectional view illustrating a cross section of a portion of the pixel taken along line B-B' indicated in FIG. 3.

FIG. 4 is a bird's-eye view illustrating the configuration of an interior of the pixel 3 according to the first embodiment of the disclosure. FIG. 5 is a top view illustrating the configuration of the interior of the pixel 3 according to the first embodiment of the disclosure. FIG. 6 is a cross-sectional view illustrating a cross section of a portion of the pixel 3 taken along line A-A' indicated in FIG. 3. FIG. 7 is a cross-sectional view illustrating a cross section of a portion of the pixel 3 taken along line B-B' indicated in FIG. 3. As illustrated in FIGS. 4 to 7, the light-emitting device 2 further includes a substrate 4. The substrate 4 is a transparent substrate constituted of a transparent material.

First R Subpixel 11

The first R subpixel 11 includes a first R light-emitting layer 21 (first light-emitting layer), a reflective electrode 31 (first opaque layer, first opaque electrode), a transparent electrode 41 (first transparent electrode), and a TFT 51. In the first R subpixel 11, the reflective electrode 31 is disposed on the display surface 20 side. The first R light-emitting layer 21 is disposed on the display surface 10 side relative to the reflective electrode 31, includes a first quantum dot, and is excited by current injection to emit red light by electro luminescence (EL). In the present embodiment, the quantum dot refers to a dot having a maximum width of 100 nm or less. The shape of the quantum dot is not particularly limited as long as it falls within a range satisfying the above-mentioned maximum width, and is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface thereof, or a combination thereof.

It is sufficient for the first quantum dot to be any quantum dot capable of emitting red light. The transparent electrode 41 is disposed on the display surface 10 side relative to the first R light-emitting layer 21. Thus, the first R light-emitting layer 21 is disposed between the reflective electrode 31 and the transparent electrode 41. The reflective electrode 31 and the TFT 51 are both disposed on the substrate 4. The TFT 51 is connected to the transparent electrode 41 and is used for injecting a current into the first R light-emitting layer 21 through the transparent electrode 41.

Second R Subpixel 12

The second R subpixel 12 includes a second R light-emitting layer 22 (second light-emitting layer), a reflective electrode 32 (second opaque layer, second opaque electrode), a transparent electrode 42 (second transparent electrode), and a TFT 52. In the second R subpixel 12, the reflective electrode 32 is disposed on the display surface 10 side. The second R light-emitting layer 22 is disposed on the display surface 20 side relative to the reflective electrode 32, includes a second quantum dot, and is excited by current injection to emit red light by EL. It is sufficient for the second quantum dot to be any quantum dot capable of emitting red light. The transparent electrode 42 is disposed on the display surface 20 side relative to the second R light-emitting layer 22. Thus, the second R light-emitting layer 22 is disposed between the reflective electrode 32 and the transparent electrode 42. The transparent electrode 42 and the TFT 52 are both disposed on the substrate 4. The TFT 52 is connected to the transparent electrode 42 and is used for injecting a current into the second R light-emitting layer 22 through the transparent electrode 42.

First G Subpixel 13

The first G subpixel 13 includes a first G light-emitting layer 23 (third light-emitting layer), a reflective electrode 33 (third opaque layer, third opaque electrode), a transparent electrode 43 (third transparent electrode), and a TFT 53. In the first G subpixel 13, the reflective electrode 33 is disposed on the display surface 20 side. The first G light-emitting layer 23 is disposed on the display surface 10 side relative to the reflective electrode 33, includes a third quantum dot, and is excited by current injection to emit green light by EL. It is sufficient for the third quantum dot to be any quantum dot capable of emitting green light. The transparent electrode 43 is disposed on the display surface 10 side relative to the first G light-emitting layer 23. Thus, the first G light-emitting layer 23 is disposed between the reflective electrode 33 and the transparent electrode 43. The reflective electrode 33 and the TFT 53 are both disposed on the substrate 4. The TFT 53 is connected to the transparent electrode 43 and is used for injecting a current into the first G light-emitting layer 23 through the transparent electrode 43.

Second G Subpixel 14

The second G subpixel 14 includes a second G light-emitting layer 24 (fourth light-emitting layer), a reflective electrode 34 (fourth opaque layer, fourth opaque electrode), a transparent electrode 44 (fourth transparent electrode), and a TFT 54. The reflective electrode 34 is disposed on the display surface 10 side. The second G light-emitting layer 24 is disposed on the display surface 20 side relative to the reflective electrode 34, includes a fourth quantum dot, and is excited by current injection to emit green light by EL. It is sufficient for the fourth quantum dot to be any quantum dot capable of emitting green light. The transparent electrode 44 is disposed on the display surface 20 side relative to the second G light-emitting layer 24. Thus, the second G light-emitting layer 24 is disposed between the reflective electrode 34 and the transparent electrode 44. The transparent electrode 44 and the TFT 54 are both disposed on the substrate 4. The TFT 54 is connected to the transparent electrode 44 and is used for injecting a current into the second G light-emitting layer 24 through the transparent electrode 44.

B Subpixel 15

The B subpixel 15 includes a B light-emitting layer 25 (fifth light-emitting layer), transparent electrodes 35 and 45, and a TFT 55. The B light-emitting layer 25 is excited by current injection and emits blue light by EL. It is sufficient that the B light-emitting layer 25 is, for example, a light-emitting layer including any quantum dot capable of emitting blue light. Alternatively, the B light-emitting layer 25 may be an organic EL layer that includes no quantum dot and emits blue light by current injection. In the B subpixel 15, the transparent electrode 35 is disposed on the display surface 10 side relative to the B light-emitting layer 25, and the transparent electrode 44 is disposed on the display surface 20 side relative to the B light-emitting layer 25. Thus, the B light-emitting layer 25 is disposed between the transparent electrode 35 and the transparent electrode 45. The transparent electrode 35 and the TFT 55 are both disposed on the substrate 4. The TFT 55 is connected to the transparent electrode 35 and is used for injecting a current into the B light-emitting layer 25 through the transparent electrode 35.

Light Emission Position of Red Light

In FIGS. 6 and 7, light emission positions (light emission directions) of red light, green light, and blue light emitted by the pixel 3 are depicted. In the first R subpixel 11, the first R light-emitting layer 21 is excited by current injection and emits red light. This red light travels toward both the display surface 10 side and the display surface 20 side. The red light traveling toward the display surface 20 side is reflected by the reflective electrode 31 disposed on the display surface 20 side, and then travels toward the display surface 10 side. Accordingly, the red light emitted from the first R light-emitting layer 21 does not pass through the display surface 20, but passes through the transparent electrode 41 disposed on the display surface 10 side, and is emitted to the outside of the light-emitting device 2 at the display surface 10 side. With this, as depicted in FIG. 6, the first R subpixel 11 does not emit red light at the display surface 20 side, but emits red light only at the display surface 10 side.

In the second R subpixel 12, the second R light-emitting layer 22 is excited by current injection and emits red light. This red light travels toward both the display surface 10 side and the display surface 20 side. The red light traveling toward the display surface 10 side is reflected by the reflective electrode 32 disposed on the display surface 10 side, and then travels toward the display surface 20 side. Accordingly, the red light emitted from the second R light-emitting layer 22 does not pass through the display surface 10, but passes through the transparent electrode 42 disposed on the display surface 20 side and the substrate 4, and is emitted to the outside of the light-emitting device 2 at the display surface 20 side. With this, as depicted in FIG. 7, the second R subpixel 12 does not emit red light at the display surface 10 side, but emits red light only at the display surface 20 side.

Light Emission Position of Green Light

In the first G subpixel 13, the first G light-emitting layer 23 is excited by current injection and emits green light. This green light travels toward both the display surface 10 side and the display surface 20 side. The green light traveling toward the display surface 20 side is reflected by the reflective electrode 33 disposed on the display surface 20 side, and then travels toward the display surface 10 side. Accordingly, the green light emitted from the first G light-emitting layer 23 does not pass through the display surface 20, but passes through the transparent electrodes 43 disposed on the display surface 10 side, and is emitted to the outside of the light-emitting device 2 at the display surface 10 side. With this, as depicted in FIG. 6, the first G subpixel 13 does not emit green light at the display surface 20 side, but emits green light only at the display surface 10 side.

In the second G subpixel 14, the second G light-emitting layer 24 is excited by current injection and emits green light. This green light travels toward both the display surface 10 side and the display surface 20 side. The green light traveling toward the display surface 10 side is reflected by the reflective electrode 34 disposed on the display surface 10 side, and then travels toward the display surface 20 side. Accordingly, the green light emitted from the second G light-emitting layer 24 does not pass through the display surface 10, but passes through the transparent electrode 44 disposed on the display surface 20 side and the substrate 4, and is emitted to the outside of the light-emitting device 2 at the display surface 20 side. With this, as depicted in FIG. 7, the second G subpixel 14 does not emit green light at the display surface 10 side, but emits green light only at the display surface 20 side.

The B light-emitting layer 25 of the B subpixel 15 is excited by current injection and emits blue light. This blue light travels toward both the display surface 10 side and the display surface 20 side. The blue light traveling toward the display surface 10 side passes through the transparent electrode 35 disposed on the display surface 10 side. Accordingly, the blue light traveling toward the display surface 10 side passes through the display surface 10, and is emitted to the outside of the light-emitting device 2 at the display surface 10 side. The blue light traveling toward the display surface 20 side passes through the transparent electrode 45 disposed on the display surface 20 side and the substrate 4. Accordingly, the blue light traveling toward the display surface 20 side passes through the display surface 20 and is emitted to the outside of the light-emitting device 2 at the display surface 20 side. With this, as depicted in FIG. 6 and FIG. 7, the B subpixel 15 emits blue light at both the display surface 10 side and the display surface 20 side.

In the B subpixel 15, blue light emitted from the B light-emitting layer 25 passes through both the display surface 10 side and the display surface 20 side, and is emitted to the outside of the light-emitting device 2. Thus, blue light with a luminance level of about half the total luminance of the blue light emitted from the B light-emitting layer 25 is emitted at each of the display surface 10 side and the display surface 20 side.

Main Effects

The light-emitting device 2 emits red, green, and blue light to the display surface 10 side using the first R subpixel 11, the first G subpixel 13, and the B subpixel 15 included in the pixel 3. Accordingly, the light-emitting device 2 can display RGB tri-color information (an image or the like) on the display surface 10. The light-emitting device 2 further emits red, green, and blue light to the display surface 20 side using the second R subpixel 12, the second G subpixel 14, and the B subpixel 15 included in the same pixel 3. Accordingly, the light-emitting device 2 can also display on the display surface 20 the same information (the image or the like) as the RGB tri-color information displayed on the display surface 10. Thus, the light-emitting device 2 is a double-sided light-emitting device able to display the same information on both the display surface 10 and the display surface 20.

Furthermore, in the light-emitting device 2, the B subpixel 15 includes no reflective electrode. That is, the B subpixel 15 is a transmissive-type subpixel configured to emit blue light. Accordingly, the user can visually recognize both an image or the like displayed on the display surface 10 and a real image present behind the display surface 20 of the light-emitting device 2 through the B subpixel 15 in each pixel 3 included in the light-emitting device 2. When the user visually recognizes an image or the like displayed on the display surface 20, the user can visually recognize a real image present behind the display surface 10 of the light-emitting device 2 through the B subpixel 15 in each pixel 3 included in the light-emitting device 2. As described above, the light-emitting device 2 is such a transparent light-emitting device that the light-emitting device 2 itself is transparent.

In the first R subpixel 11, since background light (external light) is blocked by the reflective electrode 31 disposed on the display surface 20 side, the first R light-emitting layer 21 in the first R subpixel 11 is not irradiated with the background light. As a result, it is possible to prevent the first R light-emitting layer 21 including the first quantum dot from being excited by the background light and emitting red light by photo luminescence (PL). In the second R subpixel 12, since background light is blocked by the reflective electrode 32 disposed on the display surface 10 side, the second R light-emitting layer 22 in the second R subpixel 12 is not irradiated with the background light. As a result, it is possible to prevent the second R light-emitting layer 22 including the second quantum dot from being excited by the background light and emitting red light by PL. For the same reason, it is also possible to prevent the first G light-emitting layer 23 including the third quantum dot and the second G light-emitting layer 24 including the fourth quantum dot from being excited by the background light and emitting green light by PL.

When the B light-emitting layer 25 in the B subpixel 15 includes no quantum dot, it is not excited by the background light and does not emit blue light. Even when the B light-emitting layer 25 in the B subpixel 15 includes a quantum dot, the B light-emitting layer 25 does not emit blue light by PL unless it is irradiated with ultraviolet light. The display apparatus 1 preferably includes a layer for blocking ultraviolet light on each of the display surface 10 and the display surface 20. This makes it possible to prevent the B light-emitting layer 25 from being irradiated with ultraviolet light, and therefore it is possible to prevent the B light-emitting layer 25 including the quantum dot from being excited by the ultraviolet light contained in the external light and emitting blue light by PL.

As described above, according to the present embodiment, the transmissive-type light-emitting device 2 is provided, in which information can be displayed on both the display surface 10 and the display surface 20 (both surfaces of the light-emitting device 2), and unwanted PL light emission caused by the background light is not performed.

Area of Each Subpixel

As illustrated in FIG. 3, each of the first R subpixel 11, the second R subpixel 12, the first G subpixel 13, and the second G subpixel 14 has a square shape. The shape of these subpixels is not necessarily limited to a square shape and may take another shape. The B subpixel 15 has a rectangular shape. The B subpixel 15 is not limited to the rectangular shape and may have another shape. In the B subpixel 15, the length of the long side is twice the length of the short side. The length of the short side of the B subpixel 15 is equal to the length of each side of the first R subpixel 11, the second R subpixel 12, the first G subpixel 13, and the second G subpixel 14. Each of the first R subpixel 11, the second R subpixel 12, the first G subpixel 13, and the second G subpixel 14 is adjacent to the long side portion of the B subpixel 15.

In the present embodiment, the first R subpixel 11, the second R subpixel 12, the first G subpixel 13, and the second G subpixel 14 have the same area in size. Therefore, when currents having the same normal drive current value are respectively injected into the first R subpixel 11 and the second R subpixel 12, and currents having the same normal drive current value are respectively injected into the first G subpixel 13 and the second G subpixel 14, the first R subpixel 11, the second R subpixel 12, the first G subpixel 13, and the second G subpixel 14 emit light with the same luminance. In this case, the "normal drive current value" refers to a current drive value that is set in such a manner that, in a general light-emitting device where the areas of each of the RGB subpixels are the same in size, the maximum luminance of light emitted from each subpixel is equal to each other on the display surface of the light-emitting device. Note that "being the same" is not necessarily completely the same, and a difference in a range of about ±5% may be regarded as being the same.

Meanwhile, the area of the B subpixel 15 is twice the area of each of the first R subpixel 11, the second R subpixel 12, the first G subpixel 13, and the second G subpixel 14. Accordingly, when a current having the normal drive current value is injected into the B subpixel 15, the B subpixel 15 emits blue light with luminance being twice the luminance of light emitted from each of the first R subpixel 11, the second R subpixel 12, the first G subpixel 13, and the second G subpixel 14. In this case, the term "twice" is not limited to "completely twice", and may refer to a magnification in consideration of deterioration of the display apparatus 1, a manufacturing error of the display apparatus 1, or an error depending on a measurement environment.

At this time, blue light emitted from the B light-emitting layer 25 is emitted from both the display surface 10 and the display surface 20. Therefore, the luminance of the blue light from the display surface 10 and the luminance of the blue light from the display surface 20 are each about half the luminance of the blue light emitted from the B light-emitting layer 25. As a result, by a normal current drive, the luminance of blue light emitted from the display surface 10 can be made substantially equal to the luminance of red light emitted from the first R subpixel 11 and the luminance of green light emitted from the first G subpixel 13. Here, the above-mentioned pieces of the luminance are considered to be substantially equal to each other, but may be made completely equal to each other by fine adjustment. The completely equal luminance may be achieved through pre-shipment adjustment. Further, the luminance of blue light emitted from the display surface 20 can be made substantially equal to the luminance of red light emitted from the second R subpixel 12 and the luminance of green light emitted from the second G subpixel 14. Here, the above-mentioned pieces of the luminance are considered to be substantially equal to each other, but may be made completely equal to each other by fine adjustment. The completely equal luminance may be achieved through pre-shipment adjustment.

Accordingly, the light-emitting device 2 can display information on both the display surface 10 and the display surface 20 by the normal current drive without losing the balance of each of colors of information. That is, the light-emitting device 2 can perform double-sided display of information by the normal current drive without changing the drive method from the known light-emitting device. This makes it unnecessary to change the settings of members such as a source driver and a timing controller necessary for driving the light-emitting device 2, to settings dedicated to the light-emitting device 2. In other words, for these members, members provided in the known light-emitting device can be used without any change.

The area of the B subpixel 15 may be twice or more the area of each of the first R subpixel 11, the second R subpixel 12, the first G subpixel 13, and the second G subpixel 14. With this, the B light-emitting layer 25 having low luminous efficiency can be driven by a relatively low current.

Banks 61 to 66

As illustrated in FIG. 4, the pixel 3 further includes banks 61 to 66. The banks 61 to 64 are banks for separating each of the subpixels that emits light of different colors from each other among the first R subpixel 11, the second R subpixel 12, the first G subpixel 13, the second G subpixel 14, and the B subpixel 15. To be specific, the bank 61 separates the second R subpixel 12 and the first G subpixel 13 from the B subpixel 15. The bank 62 separates the first R subpixel 11 and the second G subpixel 14 from the B subpixel 15. The bank 63 separates the second R subpixel 12 from the first G subpixel 13. The bank 64 separates the first R subpixel 11 from the second G subpixel 14.

The bank 65 and the bank 66 are banks for separating different pixels 3. The bank 65 separates the pixel 3 from the first pixel 3 adjacent to the pixel 3. In the present embodiment, "adjacency of pixels 3" means that two different pixels 3 share at least part of a boundary line defining the pixels 3. The bank 66 separates the pixel 3 from the second pixel 3 adjacent to the pixel 3.

The bank 61 and the bank 62 are each entirely constituted of a reflective electrode (opaque electrode). More specifically, the bank 61 and the bank 62 may be constituted of the same material as that of the reflective electrodes 31 to 34. On the other hand, none of the bank 63 and the bank 64 are constituted of reflective electrodes. More specifically, the bank 63 and the bank 64 are constituted of a transparent material.

As illustrated in FIG. 4, the reflective electrode constituting the bank 61 or the bank 62 is connected to at least any of the reflective electrodes in the first R subpixel 11, the second R subpixel 12, the first G subpixel 13, and the second G subpixel 14. More specifically, the reflective electrode constituting the bank 62 is connected to the reflective electrode 31 in the first R subpixel 11 and the reflective electrode 34 in the second G subpixel 14.

Since the bank 62 is constituted of a reflective electrode, the bank 62 blocks blue light emitted from the B light-emitting layer 25. Thus, the blue light emitted from the B light-emitting layer 25 does not enter the first R light-emitting layer 21 in the first R subpixel 11 adjacent to the B subpixel 15 through the bank 62. This makes it possible to prevent the first R light-emitting layer 21 including the first quantum dot from being excited by the blue light emitted from the B light-emitting layer 25 and emitting red light by PL in the first R subpixel 11. In addition, the blue light emitted from the B light-emitting layer 25 does not enter the second G light-emitting layer 24 in the second G subpixel 14 adjacent to the B subpixel 15 through the bank 62. This makes it possible to prevent the second G light-emitting layer 24 including the fourth quantum dot from being excited by the blue light emitted from the B light-emitting layer 25 and emitting green light by PL in the second G subpixel 14.

Since the bank 61 is constituted of a reflective electrode, the bank 61 blocks blue light emitted from the B light-emitting layer 25. Thus, the blue light emitted from the B light-emitting layer 25 does not enter the second R light-emitting layer 22 in the second R subpixel 12 adjacent to the B subpixel 15 through the bank 61. This makes it possible to prevent the second R light-emitting layer 22 including the second quantum dot from being excited by the blue light emitted from the B light-emitting layer 25 and emitting red light by PL in the second R subpixel 12. In addition, the blue light emitted from the B light-emitting layer 25 does not enter the first G light-emitting layer 23 in the first G subpixel 14 adjacent to the B subpixel 15 through the bank 61. This makes it possible to prevent the first G light-emitting layer 23 including the third quantum dot from being excited by the blue light emitted from the B light-emitting layer 25 and emitting green light by PL in the first G subpixel 13.

In the pixel 3, the bank 61, the bank 62, the bank 65, and the bank 66 constituted of the reflective electrodes are connected to each other. Furthermore, the bank 62 is connected to the reflective electrode 31 in the first R subpixel 11 and the reflective electrode 34 in the second G subpixel 14. The bank 66 is connected to the reflective electrode 32 in the second R subpixel 12 and the reflective electrode 33 in the first G subpixel 13. As described above, in the pixel 3, the reflective electrodes 31 to 34 are electrically connected to the bank 61, the bank 62, the bank 65, and the bank 66. Thus, for example, by only applying a common voltage to the bank 65, the same common voltage can be applied to the reflective electrodes 31 to 34 electrically connected to the bank 65. Accordingly, since it is unnecessary to provide individual wiring lines for individually applying the common voltage to the reflective electrodes 31 to 34 in the pixel 3, the configuration of the pixel 3 can be further simplified.

In the pixel 3, the reflective electrode 33 and the reflective electrode 32 may be connected to the bank 61 instead of the bank 66.

In the pixel 3, the entire bank 63 for separating the second R subpixel 12 from the first G subpixel 13 may be constituted of a reflective electrode. In this case, the bank 63 blocks green light emitted from the first G light-emitting layer 23. Thus, the green light emitted from the first G light-emitting layer 23 does not enter the second R light-emitting layer 22 in the second R subpixel 12 adjacent to the first G subpixel 13 through the bank 63. This makes it possible to prevent the second R light-emitting layer 22 including the second quantum dot from being excited by the green light emitted from the first G light-emitting layer 23 and emitting red light by PL in the second R subpixel 12.

In the pixel 3, the entire bank 64 for separating the first R subpixel 11 from the second G subpixel 14 may be constituted of a reflective electrode. In this case, the bank 64 blocks green light emitted from the second G light-emitting layer 24. Thus, the green light emitted from the second G light-emitting layer 24 does not enter the first R light-emitting layer 21 in the first R subpixel 11 adjacent to the second G subpixel 14 through the bank 64. This makes it possible to prevent the first R light-emitting layer 21 including the first quantum dot from being excited by the green light emitted from the second G light-emitting layer 24 and emitting red light by PL in the first R subpixel 11.

Each of the banks 61 to 66 does not necessarily need to be entirely constituted of a reflective electrode. That is, it is sufficient that at least part of each of the banks 61 to 66 is constituted of a reflective electrode. For example, the inside of each of the banks 61 to 66 may be made of a reflective electrode, and the reflective electrode inside each of the banks 61 to 66 may be covered with a material other than the reflective electrode. In the present example, the reflective electrode 33 and the reflective electrode 32 are connected to the reflective electrode disposed inside the bank 66. Further, the reflective electrode disposed inside the bank 62 is connected to the reflective electrode 31 and the reflective electrode 34.

Advantageous Effects by Disposition of Each Subpixel

As illustrated in FIG. 3, the first R subpixel 11 is adjacent to subpixels other than another first R subpixel 11 and the first G subpixel 13. The first G subpixel 13 is adjacent to subpixels other than another first G subpixel 13 and the first R subpixel 11. Thus, in the pixel 3, the first R subpixel 11 having the reflective electrode 31 disposed on the display surface 20 side is not adjacent to the first G subpixel 13 having the reflective electrodes 33 disposed on the display surface 20 side.

The second R subpixel 12 is adjacent to subpixels other than another second R subpixel 12 and the second G subpixel 14. The second G subpixel 14 is adjacent to subpixels other than another second G subpixel 14 and the second R subpixel 12. Thus, in the pixel 3, the second R subpixel 12 having the reflective electrode 32 disposed on the display surface 10 side is not adjacent to the second G subpixel 14 having the reflective electrode 34 disposed on the display surface 10 side.

Since the light-emitting device 2 employs the arrangement as illustrated in FIG. 3, the light-emitting device 2 does not have a region where pixels that are not displayed are continuously arranged on any of the display surface 10 side and the display surface 20 side. That is, the light-emitting device 2 includes a plurality of pixels 3, in which the reflective electrodes of each of the subpixels are not continuously arranged on the display surface 10 side or the display surface 20 side, and each of the subpixels is arranged in a planar form. Thus, the light-emitting device 2 can display a smooth image or the like on both the display surface 10 and the display surface 20.

Another Example of Area of Subpixel

Figure 8:
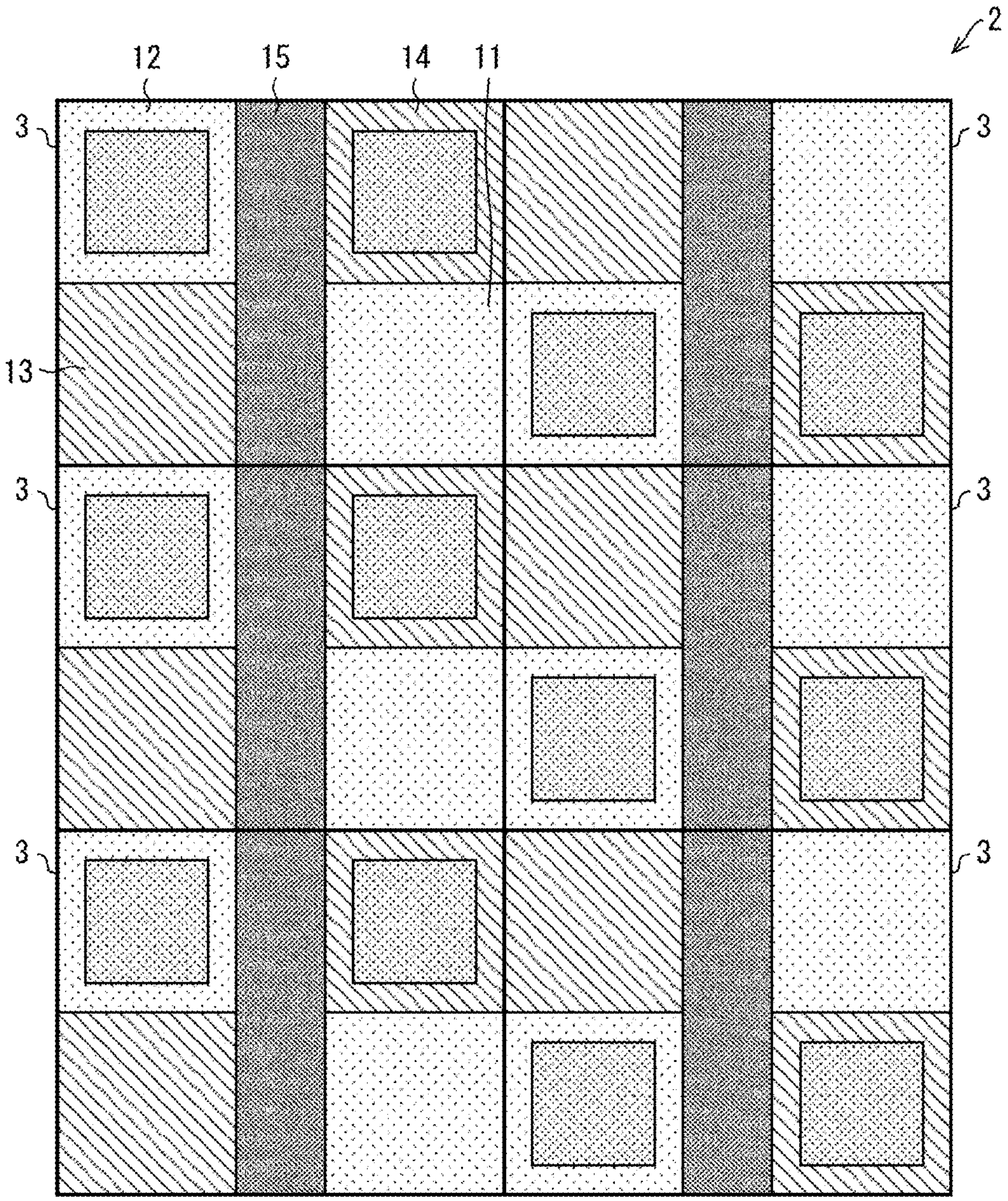
FIG. 8 is a diagram illustrating another configuration example of the pixel according to the first embodiment of the disclosure.

FIG. 8 is a diagram illustrating another configuration example of the pixel 3. As illustrated in FIG. 8, in the pixel 3, the area of the B subpixel 15 may be equal to the area of each of the first R subpixel 11, the second R subpixel 12, the first G subpixel 13, and the second G subpixel 14. In this example, when a normal drive current value is injected into these subpixels, the luminance of light emitted from each subpixel is equal to each other. At this time, since the blue light emitted from the B subpixel 15 is emitted toward both the display surface 10 and the display surface 20, the luminance of the blue light comes to be about half the luminance of each of the red light and the green light emitted only toward the display surface 10 or the display surface 20.

Therefore, in the present example, it is preferable that the value of the current injected into the B subpixel 15 be set to about twice the normal drive current value for the B subpixel 15. This makes it possible to cause the luminance of the blue light emitted from the B subpixel 15 to be twice the luminance of each of the red light and the green light emitted from the other subpixels. As a result, the luminance of the blue light output from each of the display surface 10 and display surface 20 can be made substantially equal to the luminance of each of the red light and green light. Accordingly, the light-emitting device 2 can display information on both the display surface 10 and the display surface 20 without losing the balance of each of colors of the information to be displayed.

Another Modified Example

The reflective electrodes 31 to 34 are each required to be an electrode having a light reflectivity of 70% or more. The pixel 3 may include opaque electrodes having a light transmittance of 20% or less instead of the reflective electrodes 31 to 34. In this configuration, the reflectivity at the electrodes of the red light and green light decreases. Then, in order to perform the normal current drive, the first R subpixel 11, the second R subpixel 12, and the first G subpixel 13 are only required to appropriately adjust the area ratio with respect to the second G subpixel 14 and the B subpixel 15.

Alternatively, the pixel 3 may include opaque layers having a light transmittance of 20% or less instead of the reflective electrodes 31 to 34. In this case, the manufacturing of the light-emitting device 2 can be simplified by unifying all the electrodes of the pixel 3 into transparent electrodes. Then, by the change of the surfaces blocking the light with the reflective electrodes 31 to 34 to the surfaces blocking the light with the opaque layers, the transmissive-type light-emitting device 2 is provided, in which information can be displayed on both the display surface 10 and the display surface 20 (both surfaces of the light-emitting device 2), and unwanted PL light emission caused by the background light is not performed.

Second Embodiment

Figure 9:
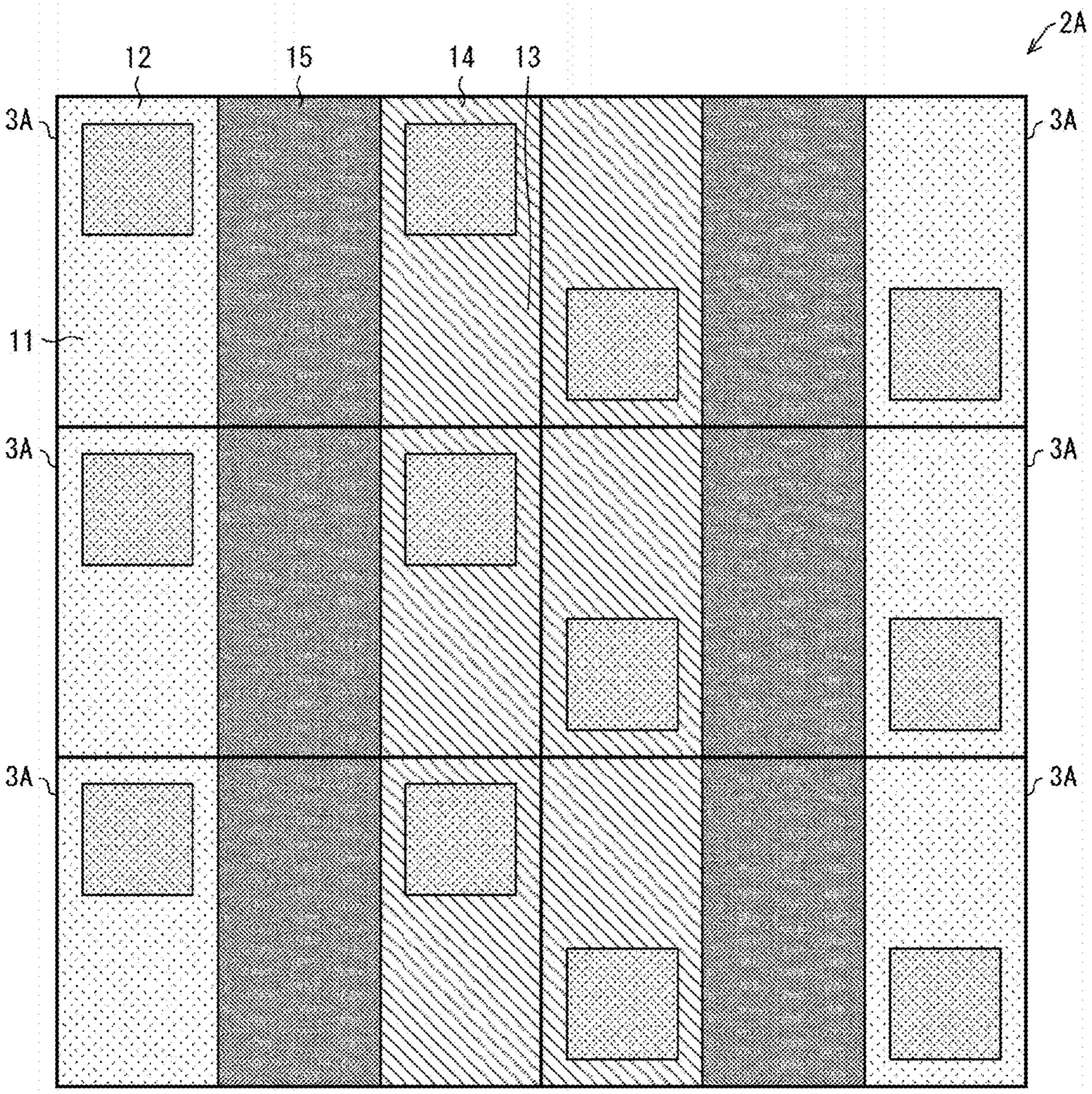
FIG. 9 is a diagram illustrating a configuration of each of pixels provided in a light-emitting device according to a second embodiment of the disclosure.
Figure 10:
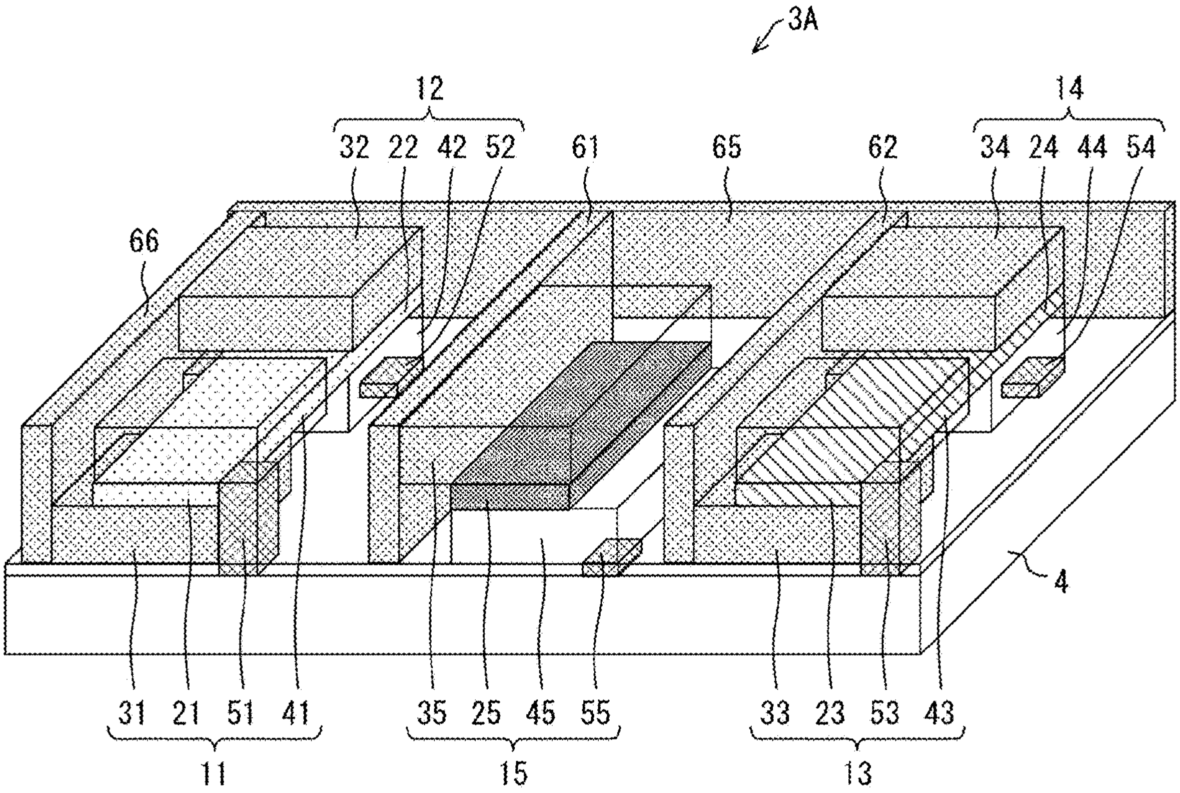
FIG. 10 is a bird's-eye view illustrating a configuration of a pixel according to the second embodiment of the disclosure.

FIG. 9 is a diagram illustrating a configuration of each of pixels 3A provided in a light-emitting device 2A according to a second embodiment of the disclosure. FIG. 10 is a bird's-eye view illustrating the configuration of the pixel 3A according to the second embodiment of the disclosure. The light-emitting device 2A according to the present embodiment includes a plurality of pixels 3A. Similarly to the pixel 3 according to the first embodiment, the pixel 3A includes a first R subpixel 11, a second R subpixel 12, a first G subpixel 13, a second G subpixel 14, and a B subpixel 15. Note that, however, in the pixel 3A, the disposition and the internal structure of each of the subpixels are different from those of the pixel 3 according to the first embodiment.

Since an adjacency relationship of each of the pixels 3A in the present embodiment is the same as the adjacency relationship of each of the pixels 3 in the first embodiment, detailed description thereof will be omitted. In the present embodiment, "adjacency of pixels 3A" means that two different pixels 3A share at least part of a boundary line defining the pixels 3A. The adjacency relationship of each of the subpixels in the present embodiment is different from the adjacency relationship of each of the subpixels in the first embodiment. In the present embodiment, "adjacency of subpixels" means that two different subpixels share at least part of a boundary line defining the pixel 3A or any of the subpixels.

As illustrated in FIG. 9, in the pixel 3A, the first R subpixel 11 is adjacent to the second R subpixel 12 and the B subpixel 15. The second R subpixel 12 is adjacent to the first R subpixel 11 and the B subpixel 15. The first G subpixel 13 is adjacent to the second G subpixel 14 and the B subpixel 15. The second G subpixel 14 is adjacent to the first G subpixel 13 and the B subpixel 15. The B subpixel 15 is adjacent to all of the other four subpixels.

More specifically, the first R subpixel 11 and the second R subpixel 12 in the pixel 3A are adjacent to each other. Further, a first R light-emitting layer 21 of the first R subpixel 11 and a second R light-emitting layer 22 of the second R subpixel 12 are made to be a common layer. In other words, one R light-emitting layer including the first R light-emitting layer 21 and the second R light-emitting layer 22 is disposed across the first R subpixel 11 and the second R subpixel 12. Therefore, since it is unnecessary to form a bank for separating the first R subpixel 11 and the second R subpixel 12 from each other, the light-emitting device 2A may be more easily manufactured.

The first G subpixel 13 and the second G subpixel 14 in the pixel 3A are adjacent to each other. In addition, a first G light-emitting layer 23 of the first G subpixel 13 and a second G light-emitting layer 24 of the second G subpixel 14 are made to be a common layer. In other words, one G light-emitting layer including the first G light-emitting layer 23 and the second G light-emitting layer 24 is disposed across the first G subpixel 13 and the second G subpixel 14. Therefore, since it is unnecessary to form a bank for separating the first G subpixel 13 and the second G subpixel 14 from each other, the light-emitting device 2A may be more easily manufactured.

As illustrated in FIG. 9, the first R subpixel 11 in a certain pixel 3A is adjacent to the second R subpixel 12 in another first pixel 3A adjacent to the certain pixel 3A. Further, the second R subpixel 12 in the certain pixel 3A is adjacent to the first R subpixel 11 in another second pixel 3A adjacent to the certain pixel 3A. Accordingly, the first R light-emitting layers 21 in the first R subpixels 11 in each of the pixels 3A for one column constituting the light-emitting device 2A, and the second R light-emitting layers 22 in the second R subpixels 12 in each of the pixels 3A for the above one column are all made to be a common layer. That is, one R light-emitting layer is disposed across each of the pixels 3A in one column. As a result, since it is unnecessary to form a bank for separating the first R subpixel 11 in a certain pixel 3A from the second R subpixel 12 in another pixel 3A, the light-emitting device 2A may be more easily manufactured.

As illustrated in FIG. 9, the first G subpixel 13 in a certain pixel 3A is adjacent to the second G subpixel 14 in another first pixel 3A adjacent to the certain pixel 3A. The second G subpixel 14 in the certain pixel 3A is adjacent to the first G subpixel 13 in another second pixel 3A adjacent to the certain pixel 3A. Accordingly, the first G light-emitting layers 23 in each of the first G subpixels 13 in each of the pixels 3A for one column constituting the light-emitting device 2A, and the second G light-emitting layers 24 in each of the second G subpixels 14 in each of the pixels 3A for the above one column are all made to be a common layer. That is, one G light-emitting layer is disposed across each of the pixels 3A in one column. As a result, since it is unnecessary to form a bank for separating the first G subpixel 13 in a certain pixel 3A from the second G subpixel 14 in another pixel 3A, the light-emitting device 2A may be more easily manufactured.

In the light-emitting device 2A, the first R subpixel 11, the first G subpixel 13, and the B subpixel 15 emit light at the display surface 10. Further, the second R subpixel 12, the second G subpixel 14, and the B subpixel 15 emit light at the display surface 20. Accordingly, similar to the light-emitting device 2 discussed above, the light-emitting device 2A can display the same information on both the display surface 10 and the display surface 20.

As illustrated in FIG. 9, in the light-emitting device 2A, the shapes of the first R subpixel 11, the second R subpixel 12, the first G subpixel 13, the second G subpixel 14, and the B subpixel 15 are respectively the same as the shapes of the first R subpixel 11, the second R subpixel 12, the first G subpixel 13, the second G subpixel 14, and the B subpixel 15 illustrated in FIG. 3. In other words, the first R subpixel 11, the second R subpixel 12, the first G subpixel 13, and the second G subpixel 14 have the same area in size. Meanwhile, the area of the B subpixel 15 is twice the area of each of the first R subpixel 11, the second R subpixel 12, the first G subpixel 13, and the second G subpixel 14. Accordingly, similar to the light-emitting device 2 illustrated in FIG. 3, the light-emitting device 2A can display information on both the display surface 10 and the display surface 20 by a normal current drive without losing the balance of each of colors of information.

Modified Example

Figure 11:
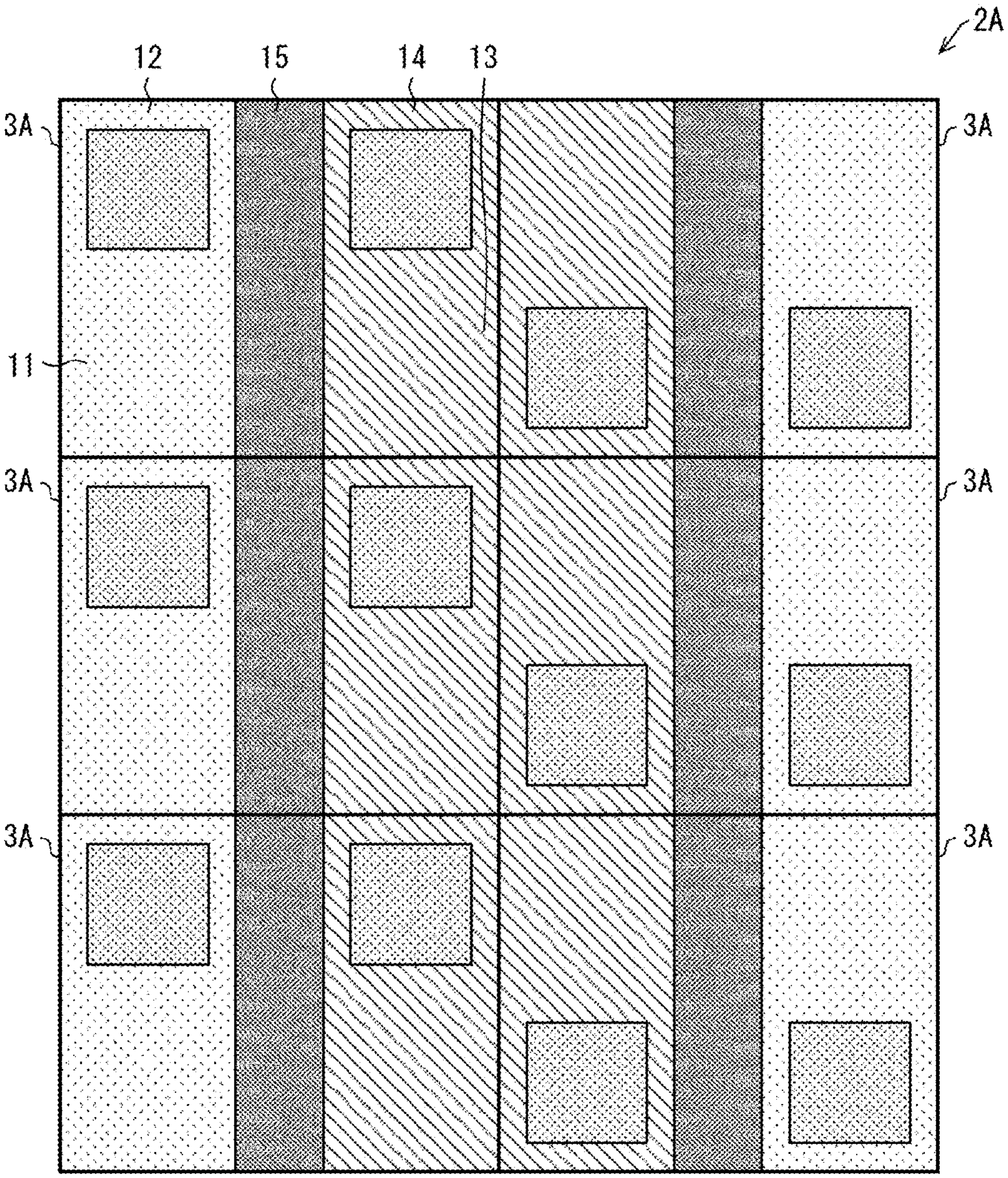
FIG. 11 is a diagram illustrating another configuration of the pixel according to the second embodiment of the disclosure.

FIG. 11 is a diagram illustrating another configuration of the pixel 3A according to the second embodiment of the disclosure. As illustrated in FIG. 11, in the pixel 3A, the area of the B subpixel 15 may be equal to the area of each of the first R subpixel 11, the second R subpixel 12, the first G subpixel 13, and the second G subpixel 14. Similar to the light-emitting device 2 illustrated in FIG. 8, the light-emitting device 2A according to the present example can display information on both the display surface 10 and the display surface 20 without losing the balance of colors of the information to be displayed.

Third Embodiment

Figure 12:
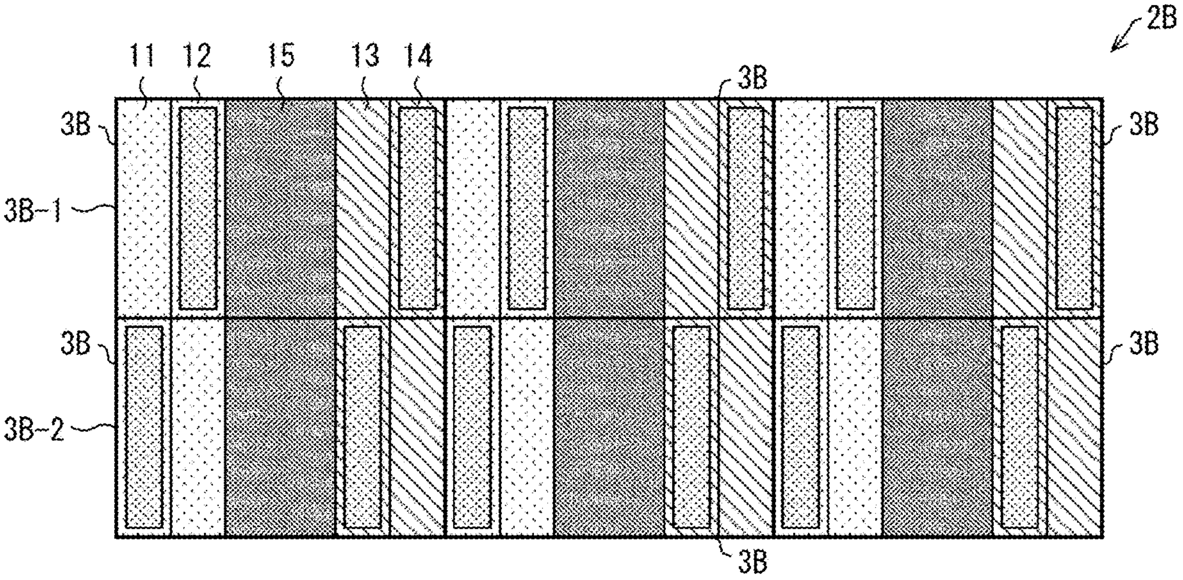
FIG. 12 is a diagram illustrating a configuration of a pixel provided in a light-emitting device according to a third embodiment of the disclosure.

FIG. 12 is a diagram illustrating a configuration of each of pixels 3B provided in a light-emitting device 2B according to a third embodiment of the disclosure. The light-emitting device 2B according to the present embodiment includes a plurality of pixels 3B disposed on a plane. Similar to the pixel 3 according to the first embodiment, the pixel 3B includes a first R subpixel 11, a second R subpixel 12, a first G subpixel 13, a second G subpixel 14, and a B subpixel 15. Note that, however, in the pixel 3B, the shape and the disposition of each of the subpixels are different from those of the pixel 3 according to the first embodiment.

Since an adjacency relationship of each of the pixels 3B in the present embodiment is the same as the adjacency relationship of each of the pixels 3 in the first embodiment, detailed description thereof will be omitted. In the present embodiment, "adjacency of pixels 3B" means that two different pixels 3B share at least part of a boundary line defining the pixels 3B. The adjacency relationship of each of the subpixels in the present embodiment is different from the adjacency relationship of each of the subpixels in the first embodiment. In the present embodiment, "adjacency of subpixels" means that two different subpixels share at least part of a boundary line defining the pixel 3B or any of the subpixels.

As illustrated in FIG. 12, all of the five subpixels are disposed to be aligned in a row in the pixel 3B. To be specific, in a first pixel 3B-1 included in an odd-numbered row of the light-emitting device 2B, the first R subpixel 11, the second R subpixel 12, the B subpixel 15, the first G subpixel 13, and the second G subpixel 14 are disposed to be aligned in this order. In a second pixel 3B-2 included in an even-numbered row of the light-emitting device 2B, the second R subpixel 12, the first R subpixel 11, the B subpixel 15, the second G subpixel 14, and the first G subpixel 13 are disposed to be aligned in this order. The second pixel 3B-2 may be included in an odd-numbered row of the light-emitting device 2B, and the first pixel 3B-1 may be included in an even-numbered row of the light-emitting device 2B.

In the pixel 3B, the first R subpixel 11 is adjacent to subpixels other than another first R subpixel 11 and the first G subpixel 13. In the example of FIG. 12, in the pixel 3B-1, the first R subpixel 11 is adjacent to the second R subpixel 12 and the second G subpixel 14, and is adjacent to none of the first G subpixel 13 and the B subpixel 15. On the other hand, in the pixel 3B-2, the first R subpixel 11 is adjacent to the second R subpixel 12 and the B subpixel 15, and is adjacent to none of the first G subpixel 13 and the second G subpixel 14.

In the pixel 3B, the second R subpixel 12 is adjacent to subpixels other than another second R subpixel 12 and the second G subpixel 14. In the example of FIG. 12, in the pixel 3B-1, the second R subpixel 12 is adjacent to the first R subpixel 11 and the B subpixel 15, and is adjacent to none of the first G subpixel 13 and the second G subpixel 14. On the other hand, in the pixel 3B-2, the second R subpixel 12 is adjacent to the first R subpixel 11 and the first G subpixel 13, and is adjacent to none of the second G subpixel 14 and the B subpixel 15.

In the pixel 3B, the first G subpixel 13 is adjacent to subpixels other than another first G subpixel 13 and the first R subpixel 11. In the example of FIG. 12, in the pixel 3B-1, the first G subpixel 13 is adjacent to the second G subpixel 14 and the B subpixel 15, and is adjacent to none of the first R subpixel 11 and the second R subpixel 12. On the other hand, in the pixel 3B-2, the first G subpixel 13 is adjacent to the second G subpixel 14 and the second R subpixel 12, and is adjacent to none of the first R subpixel 11 and the B subpixel 15.

In the pixel 3B, the second G subpixel 14 is adjacent to subpixels other than another second G subpixel 14 and the second R subpixel 12. In the example of FIG. 12, in the pixel 3B-1, the second G subpixel 14 is adjacent to the first G subpixel 13 and the first R subpixel 11, and is adjacent to none of the second R subpixel 12 and the B subpixel 15. On the other hand, in the pixel 3B-2, the second G subpixel 14 is adjacent to the first G subpixel 13 and the B subpixel 15, and is adjacent to none of the first R subpixel 11 and the second R subpixel 12.

In the light-emitting device 2B illustrated in FIG. 12, the first R subpixel 11, the first G subpixel 13, and the B subpixel 15 emit light at the display surface 10. Further, the second R subpixel 12, the second G subpixel 14, and the B subpixel 15 emit light at the display surface 20. Accordingly, similar to the light-emitting device 2 discussed above, the light-emitting device 2B can display the same information on both the display surface 10 and the display surface 20.

Advantageous Effects by Disposition of Each Subpixel

As illustrated in FIG. 12, in the pixel 3B, similarly to the pixel 3A depicted in FIG. 9, it is unnecessary to form a bank for separating the first R subpixel 11 and the second R subpixel 12 from each other. Further, similarly to the pixel 3A depicted in FIG. 9, it is unnecessary to form a bank for separating the first G subpixel 13 and the second G subpixel 14 from each other. As a result, the light-emitting device 2B including the pixels 3B may be easily manufactured.

As illustrated in FIG. 12, the first R subpixel 11 in the pixel 3B-1 is adjacent to the second R subpixel 12 in the pixel 3B-2 adjacent to and under the pixel 3B-1. Further, the second R subpixel 12 in the pixel 3B-1 is adjacent to the first R subpixel 11 in the pixel 3B-2 adjacent to and under the pixel 3B-1. Accordingly, the first R light-emitting layers 21 in each of the first R subpixels 11 in each of the pixels 3B for one column constituting the light-emitting device 2B, and the second R light-emitting layers 22 in each of the second R subpixels 12 in each of the pixels 3B for the above one column are all made to be a common layer. That is, one R light-emitting layer is disposed across each of the pixels 3B in one column. This makes it unnecessary to form a bank for separating the first R subpixel 11 in the pixel 3B-1 from the second R subpixel 12 in the pixel 3B-2. Furthermore, it is unnecessary to form a bank for separating the second R subpixel 12 in the pixel 3B-1 from the first R subpixel 11 in the pixel 3B-2. As a result, the light-emitting device 2B may be more easily manufactured.

As illustrated in FIG. 12, the first G subpixel 13 in the first pixel 3B-1 is adjacent to the second G subpixel 14 in the second pixel 3B-2 adjacent to and under the first pixel 3B-1. Further, the second G subpixel 14 in the pixel 3B-1 is adjacent to the first G subpixel 13 in the second pixel 3B-2 adjacent to and under the first pixel 3B-1. Accordingly, the first G light-emitting layers 23 in each of the first G subpixels 13 in each of the pixels 3B for one column constituting the light-emitting device 2B, and the second G light-emitting layers 24 in each of the second G subpixels 14 in each of the pixels 3B for the above one column are all made to be a common layer. That is, one G light-emitting layer is disposed across each of the pixels 3B in one column. This makes it unnecessary to form a bank for separating the first G subpixel 13 in the pixel 3B-1 from the second G subpixel 14 in the pixel 3B-2. Furthermore, it is unnecessary to form a bank for separating the second G subpixel 14 in the pixel 3B-1 from the first G subpixel 13 in the pixel 3B-2. As a result, the light-emitting device 2B may be more easily manufactured.

As illustrated in FIG. 12, the first R subpixel 11 is adjacent to subpixels other than another first R subpixel 11 and the first G subpixel 13. The first G subpixel 13 is adjacent to subpixels other than another first G subpixel 13 and the first R subpixel 11. Thus, in the pixel 3B, the first R subpixel 11 having the reflective electrode 31 disposed on the display surface 20 side is not adjacent to the first G subpixel 13 having the reflective electrodes 32 disposed on the display surface 20 side to each other.

The second R subpixel 12 is adjacent to subpixels other than another second R subpixel 12 and the second G subpixel 14. The second G subpixel 14 is adjacent to subpixels other than another second G subpixel 14 and the second R subpixel 12. Thus, in the pixel 3B, the second R subpixel 12 having the reflective electrode 32 disposed on the display surface 10 side is not adjacent to the second G subpixel 14 having the reflective electrode 34 disposed on the display surface 10 side to each other.

Since the light-emitting device 2B employs the arrangement as illustrated in FIG. 12, the light-emitting device 2B does not have a region where pixels that are not displayed are continuously arranged on any of the display surface 10 side and the display surface 20 side. That is, the light-emitting device 2B includes a plurality of pixels 3B, in which the reflective electrodes of each of the subpixels are not continuously arranged on the display surface 10 side or the display surface 20 side, and each of the subpixels is arranged in a planar form. Thus, the light-emitting device 2B can display a smooth image or the like on both the display surface 10 and the display surface 20.

Area of Each Subpixel

As illustrated in FIG. 12, each of the first R subpixel 11, the second R subpixel 12, the first G subpixel 13, and the second G subpixel 14 has a rectangular shape. In these subpixels, the length of the long side is approximately four times the length of the short side. As illustrated in FIG. 12, the B subpixel 15 has a rectangular shape. In the B subpixel 15, the length of the long side is twice the length of the short side. The length of the short side of the B subpixel 15 is approximately twice the length of each side of the first R subpixel 11, the second R subpixel 12, the first G subpixel 13, and the second G subpixel 14. Each of the subpixels is adjacent to each other in such a manner that each long side portion thereof is in contact with each other. For example, the first R subpixel 11 and the second R subpixel 12 are adjacent to each other in such a manner that a long side portion of the first R subpixel 11 and a long side portion of the second R subpixel 12 are in contact with each other.

As illustrated in FIG. 12, in the light-emitting device 2B, the first R subpixel 11, the second R subpixel 12, the first G subpixel 13, and the second G subpixel 14 have the same area in size. Meanwhile, the area of the B subpixel 15 is twice the area of each of the first R subpixel 11, the second R subpixel 12, the first G subpixel 13, and the second G subpixel 14. Accordingly, similar to the light-emitting device 2 illustrated in FIG. 3, the light-emitting device 2B can display information on both the display surface 10 and the display surface 20 by a normal current drive without losing the balance of colors of information.

Fourth Embodiment

Configuration of Light-Emitting Device 2C

Figure 13:
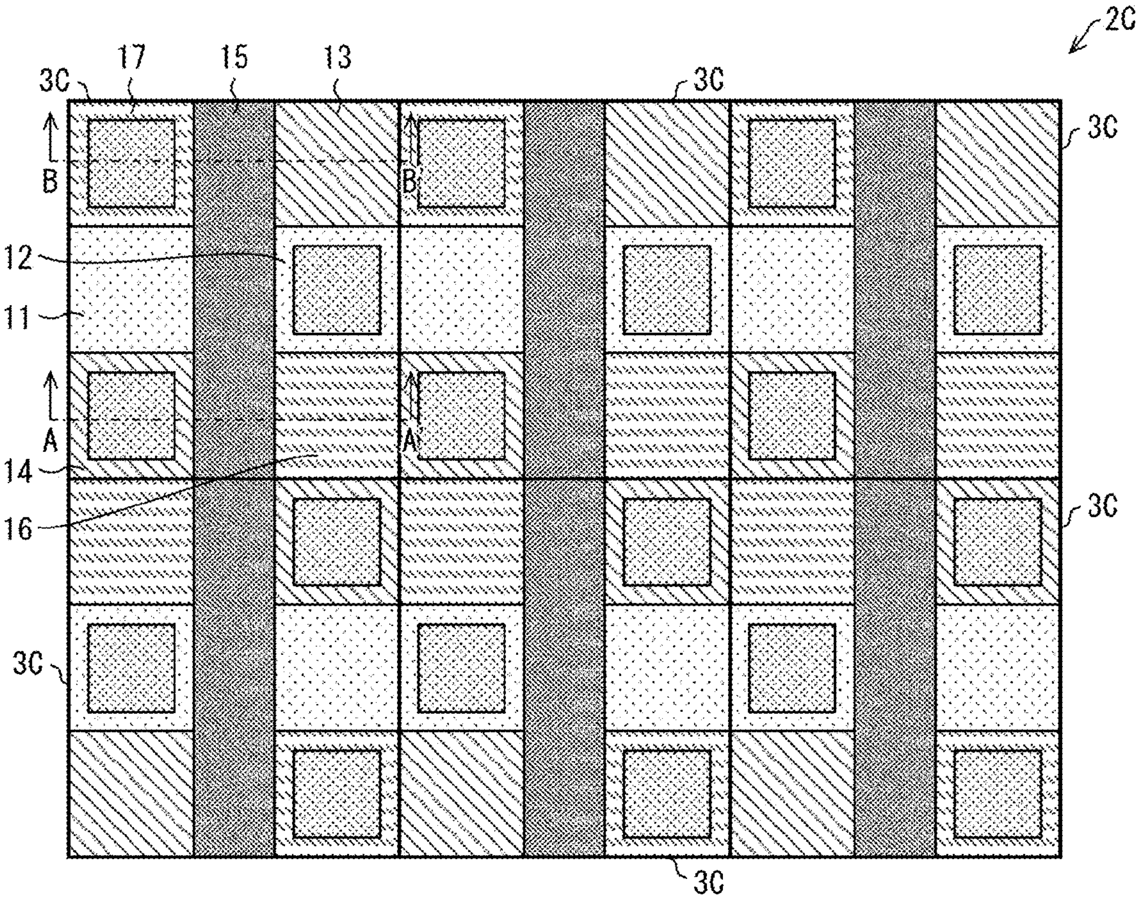
FIG. 13 is a diagram illustrating a configuration of each of pixels provided in a light-emitting device according to a fourth embodiment of the disclosure.

FIG. 13 is a diagram illustrating a configuration of each of pixels 3C provided in a light-emitting device 2C according to a fourth embodiment of the disclosure. As illustrated in FIG. 13, the light-emitting device 2C includes a plurality of pixels 3C disposed on a plane. FIG. 13 illustrates only six pixels 3C among all the pixels 3C provided in the light-emitting device 2C. In the present embodiment, each pixel 3C includes seven different subpixels. Specifically, similar to the pixel 3 according to the first embodiment, the pixel 3C includes a first R subpixel 11, a second R subpixel 12, a first G subpixel 13, a second G subpixel 14, and a B subpixel 15. The pixel 3C further includes a first Y subpixel 16 (sixth subpixel) and a second Y subpixel 17 (seventh subpixel).

Since an adjacency relationship of each of the pixels 3C in the present embodiment is the same as the adjacency relationship of each of the pixels 3 in the first embodiment, detailed description thereof will be omitted. In the present embodiment, "adjacency of pixels 3C" means that two different pixels 3C share at least part of a boundary line defining the pixels 3C. The adjacency relationship of each of the subpixels in the present embodiment is different from the adjacency relationship of each of the subpixels in the first embodiment. In the present embodiment, "adjacency of subpixels" means that two different subpixels share at least part of a boundary line defining the pixel 3C or any of the subpixels.

In the pixel 3C, the first R subpixel 11 is adjacent to subpixels other than another first R subpixel 11, the first G subpixel 13, and the first Y subpixel 16. In the example of FIG. 13, the first R subpixel 11 is adjacent to the second G subpixel 14, the B subpixel 15, and the second Y subpixel 17, and is adjacent to none of the second R subpixel 12, the first G subpixel 13, and the first Y subpixel 16.

In the pixel 3C, the second R subpixel 12 is adjacent to subpixels other than another second R subpixel 12, the second G subpixel 14, and the second Y subpixel 17. In the example of FIG. 13, the second R subpixel 12 is adjacent to the first G subpixel 13, the B subpixel 15, and the first Y subpixel 16, and is adjacent to none of the first R subpixel 11, the second G subpixel 14, and the second Y subpixel 17.

In the pixel 3C, the first G subpixel 13 is adjacent to subpixels other than another first G subpixel 13, the first R subpixel 11, and the first Y subpixel 16. In the example of FIG. 13, the first G subpixel 13 is adjacent to the second R subpixel 12 and the B subpixel 15, and is adjacent to none of the first R subpixel 11, the second G subpixel 14, the first Y subpixel 16, and the second Y subpixel 17.

In the pixel 3C, the second G subpixel 14 is adjacent to subpixels other than another second G subpixel 14, the second R subpixel 12, and the second Y subpixel 17. In the example of FIG. 13, the second G subpixel 14 is adjacent to the first R subpixel 11 and the B subpixel 15, and is adjacent to none of the second R subpixel 12, the first G subpixel 13, the first Y subpixel 16, and the second Y subpixel 17.

In the pixel 3C, the first Y subpixel 16 is adjacent to subpixels other than another first Y subpixel 16, the first R subpixel 11, and the first G subpixel 13. In the example of FIG. 13, the first Y subpixel 16 is adjacent to the second R subpixel 12 and the B subpixel 15, and is adjacent to none of the first R subpixel 11, the first G subpixel 13, the second G subpixel 14, and the second Y subpixel 17.

In the pixel 3C, the second Y subpixel 17 is adjacent to subpixels other than another second Y subpixel 17, the second R subpixel 12, and the second G subpixel 14. In the example of FIG. 13, the second Y subpixel 17 is adjacent to the first R subpixel 11 and the B subpixel 15, and is adjacent to none of the second R subpixel 12, the first G subpixel 13, the second G subpixel 14, and the first Y subpixel 16.

As illustrated in FIG. 13, the B subpixel 15 is adjacent to all of the first R subpixel 11, the second R subpixel 12, the first G subpixel 13, the second G subpixel 14, the first Y subpixel 16, and the second Y subpixel 17.

In the light-emitting device 2C, the first R subpixel 11, the first G subpixel 13, the B subpixel 15, and the first Y subpixel 16 are used for displaying red, green, blue, and yellow points on the display surface 10, respectively. On the other hand, the second R subpixel 12, the second G subpixel 14, the B subpixel 15, and the second Y subpixel 17 are used for displaying red, green, blue, and yellow points on the display surface 20, respectively. As described above, the B subpixel 15 is used for displaying a blue point on the display surface 10 and also for displaying a blue point on the display surface 20.

Light emission in each of the first R subpixel 11, the second R subpixel 12, the first G subpixel 13, the second G subpixel 14, and the B subpixel 15 is the same as the light emission in each of the corresponding subpixels of the first embodiment, and therefore detailed description thereof will be omitted. The first Y subpixel 16 emits yellow light (third color light) having a longer wavelength than blue light and being different from red and blue light at the display surface 10 side. Yellow light is, for example, light having a spectrum half value width of approximately 50 nm and a peak wavelength of 570 nm to 590 nm. To put it another way, yellow light is light having energy of 2.177 eV to 2.103 eV. The second Y subpixel emits yellow light at the display surface 20 side. As described above, both the first Y subpixel 16 and the second Y subpixel 17 emit yellow light, but the light emission directions of these pieces of yellow light are opposite to each other.

Configuration of Pixel 3C

Figure 14:
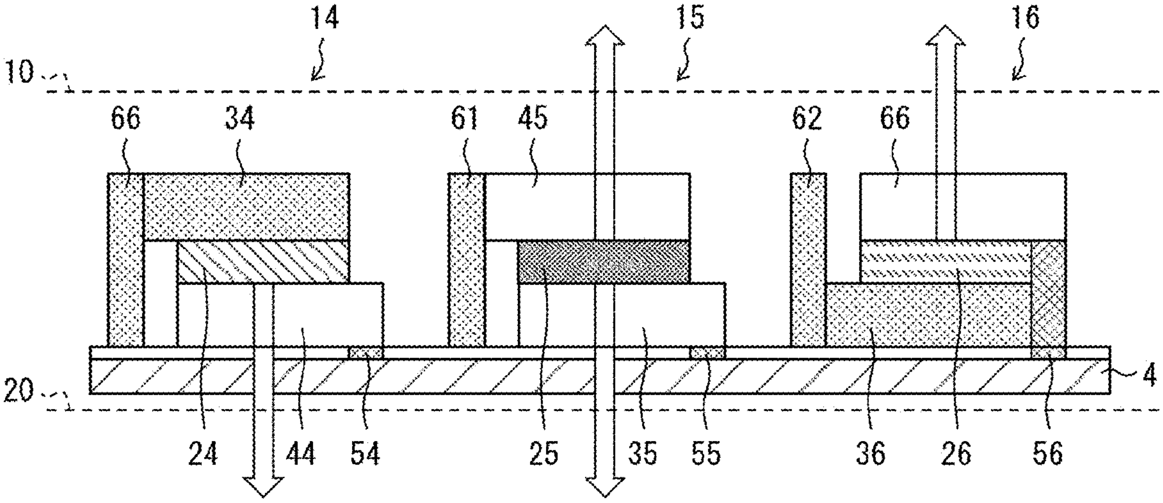
FIG. 14 is a cross-sectional view illustrating a cross section of a portion of the pixel taken along line A-A' indicated in FIG. 13.
Figure 15:
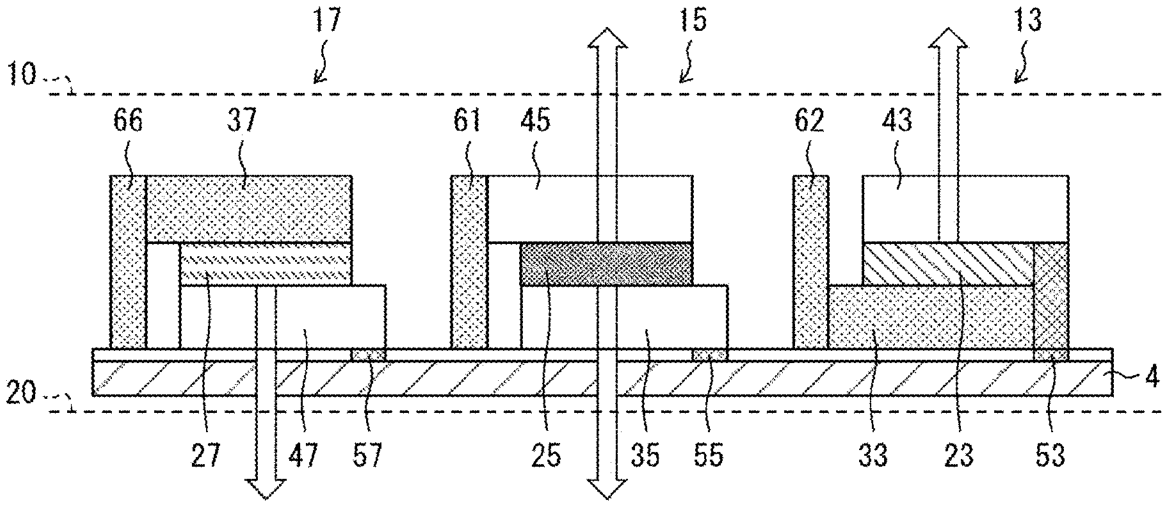
FIG. 15 is a cross-sectional view illustrating a cross section of a portion of the pixel taken along line B-B' indicated in FIG. 13.

FIG. 14 is a cross-sectional view illustrating a cross section of a portion of the pixel 3C taken along line A-A' indicated in FIG. 13. FIG. 15 is a cross-sectional view illustrating a cross section of a portion of the pixel 3C taken along line B-B' indicated in FIG. 13. The internal structure of the first R subpixel 11, the second R subpixel 12, the first G subpixel 13, the second G subpixel 14, and the B subpixel 15 according to the present embodiment is the same as the structure of the corresponding subpixels according to the first embodiment, and therefore detailed description thereof will be omitted.

First Y Subpixel 16

The first Y subpixel 16 may have the same configuration as the first R subpixel 11 or the first G subpixel 13 described above. Specifically, as illustrated in FIG. 14, the first Y subpixel 16 includes a first Y light-emitting layer 26 (sixth light-emitting layer), a reflective electrode 36 (first opaque layer, first opaque electrode), a transparent electrode 46 (first transparent electrode), and a TFT 56. In the first Y subpixel 16, the reflective electrode 36 is disposed on the display surface 20 side. The first Y light-emitting layer 26 is disposed on the display surface 10 side relative to the reflective electrode 36, includes a fifth quantum dot, and is excited by current injection to emit yellow light by EL.

It is sufficient for the fifth quantum dot to be any quantum dot capable of emitting yellow light. The transparent electrode 46 is disposed on the display surface 10 side relative to the first Y light-emitting layer 26. Thus, the first Y light-emitting layer 26 is disposed between the reflective electrode 36 and the transparent electrode 46. The reflective electrode 36 and the TFT 56 are both disposed on a substrate 4. The TFT 56 is connected to the transparent electrode 46 and is used for injecting a current into the first Y light-emitting layer 26 through the transparent electrode 46.

Second Y Subpixel 17

The second Y subpixel 17 may have the same configuration as the second R subpixel 12 or the second G subpixel 14 described above. Specifically, as illustrated in FIG. 15, the second Y subpixel 17 includes a second Y light-emitting layer 27 (seventh light-emitting layer), a reflective electrode 37 (sixth opaque layer, sixth opaque electrode), a transparent electrode 47 (sixth transparent electrode), and a TFT 57. In the second Y subpixel 17, the reflective electrode 37 is disposed on the display surface 10 side. The second Y light-emitting layer 27 is disposed on the display surface 20 side relative to the reflective electrode 37, includes a sixth quantum dot, and is excited by current injection to emit yellow light by EL.

It is sufficient for the sixth quantum dot to be any quantum dot capable of emitting yellow light. The transparent electrode 47 is disposed on the display surface 20 side relative to the second Y light-emitting layer 27. Thus, the second Y light-emitting layer 27 is disposed between the reflective electrode 37 and the transparent electrode 47. The transparent electrode 47 and the TFT 57 are both disposed on the substrate 4. The TFT 57 is connected to the transparent electrode 47 and is used for injecting a current into the second Y light-emitting layer 27 through the transparent electrode 47.

Light Emission Position of Yellow Light

In FIGS. 14 and 15, light emission positions (light emission directions) of yellow light emitted by the pixel 3C are depicted. In the first Y subpixel 16, the first Y light-emitting layer 26 is excited by current injection and emits yellow light. The yellow light travels toward both the display surface 10 side and the display surface 20 side. The yellow light traveling toward the display surface 20 side is reflected by the reflective electrode 36 disposed on the display surface 20 side, and then travels toward the display surface 10 side. Accordingly, the yellow light emitted from the first Y light-emitting layer 26 does not pass through the display surface 20, but passes through the transparent electrodes 46 disposed on the display surface 10 side, and is emitted to the outside of the light-emitting device 2C at the display surface 10 side. With this, as depicted in FIG. 14, the first Y subpixel 16 does not emit yellow light at the display surface 20 side, but emits yellow light only at the display surface 10 side.

In the second Y subpixel 17, the second Y light-emitting layer 27 is excited by current injection and emits yellow light. The yellow light travels toward both the display surface 10 side and the display surface 20 side. The yellow light traveling toward the display surface 10 side is reflected by the reflective electrode 37 disposed on the display surface 10 side, and then travels toward the display surface 20 side. Accordingly, the yellow light emitted from the second Y light-emitting layer 27 does not pass through the display surface 10, but passes through the transparent electrode 47 disposed on the display surface 20 side and the substrate 4, and is emitted to the outside of the light-emitting device 2C at the display surface 20 side. With this, as depicted in FIG. 15, the second Y subpixel 17 does not emit yellow light at the display surface 10 side, but emits yellow light only at the display surface 20 side.

The light-emitting device 2C emits red, green, blue, and yellow light to the display surface 10 side using the first R subpixel 11, the first G subpixel 13, the B subpixel 15, and the first Y subpixel 16 included in the pixel 3C. Accordingly, the light-emitting device 2C can display RGBY four-color information (an image or the like) on the display surface 10. The light-emitting device 2C further emits red, green, blue, and yellow light to the display surface 20 side using the second R subpixel 12, the second G subpixel 14, the B subpixel 15, and the second Y subpixel 17 included in the same pixel 3C. Accordingly, the light-emitting device 2C can also display on the display surface 20 the same information (the image or the like) as the RGBY four-color information displayed on the display surface 10. Thus, the light-emitting device 2C is a double-sided light-emitting device able to display the information, that is, the same information on both the display surface 10 and the display surface 20.

Advantageous Effects by Disposition of Each Subpixel

As illustrated in FIG. 13, in the pixel 3C, the first R subpixel 11 having a reflective electrode 31 disposed on the display surface 20 side is not adjacent to the first G subpixel 13 having a reflective electrode 33 disposed on the display surface 20 side, and is also not adjacent to the first Y subpixel 16 having the reflective electrode 36 disposed on the display surface 20 side. In addition, the first G subpixel 13 and the first Y subpixel 16 are not adjacent to each other. Furthermore, the second R subpixel 12 having a reflective electrode 32 disposed on the display surface 10 side is not adjacent to the second G subpixel 14 having a reflective electrode 34 disposed on the display surface 10 side, and is also not adjacent to the second Y subpixel 17 having the reflective electrode 37 on the display surface 10 side. The second G subpixel 14 and the second Y subpixel 17 are not adjacent to each other.

Since the light-emitting device 2C employs the arrangement as illustrated in FIG. 13, the light-emitting device 2C does not have a region where pixels that are not displayed are continuously arranged on any of the display surface 10 side and the display surface 20 side. Thus, the light-emitting device 2C, similar to the light-emitting device 2 according to the first embodiment, can display a smooth image or the like on both the display surface 10 and the display surface 20.

Area of Each Subpixel

As illustrated in FIG. 13, the first R subpixel 11, the second R subpixel 12, the first G subpixel 13, the second G subpixel 14, the first Y subpixel 16, and the second Y subpixel 17 each have a square shape. The shape of these subpixels is not necessarily limited to a square shape and may take another shape. The B subpixel 15 has a rectangular shape. The B subpixel 15 is not limited to a rectangular shape and may have another shape. The length of the long side of the B subpixel 15 is three times the length of each side of the first R subpixel 11, the second R subpixel 12, the first G subpixel 13, the second G subpixel 14, the first Y subpixel 16, and the second Y subpixel 17. The length of the short side of the B subpixel 15 is two-thirds the length of each side of the first R subpixel 11, the second R subpixel 12, the first G subpixel 13, the second G subpixel 14, the first Y subpixel 16, and the second Y subpixel 17. Each of the first R subpixel 11, the second R subpixel 12, the first G subpixel 13, the second G subpixel 14, the first Y subpixel 16, and the second Y subpixel 17 is adjacent to a long side portion of the B subpixel 15.

In the present embodiment, the first R subpixel 11, the second R subpixel 12, the first G subpixel 13, the second G subpixel 14, the first Y subpixel 16, and the second Y subpixel 17 have the same area in size. The area of the B subpixel 15 is twice the area of each of the first R subpixel 11, the second R subpixel 12, the first G subpixel 13, the second G subpixel 14, the first Y subpixel 16, and the second Y subpixel 17. Accordingly, similar to the light-emitting device 2 illustrated in FIG. 3, the light-emitting device 2C can display information on both the display surface 10 and the display surface 20 by a normal current drive without losing the balance of each of RGYB colors of information.

The area of the B subpixel 15 may be twice or more the area of each of the first R subpixel 11, the second R subpixel 12, the first G subpixel 13, the second G subpixel 14, the first Y subpixel 16, and the second Y subpixel 17. With this, the B light-emitting layer 25 having low luminous efficiency can be driven by a relatively low current.

The pixel 3C may include banks for separating subpixels that emit light of different colors from each other among the first R subpixel 11, the second R subpixel 12, the first G subpixel 13, the second G subpixel 14, the B subpixel 15, the first Y subpixel 16, and the second Y subpixel 17. At least part of the bank may be constituted by an opaque electrode. The opaque electrode constituting the bank may be connected to at least any of the reflective electrodes 36 and 37.

Fifth Embodiment

Figure 16:
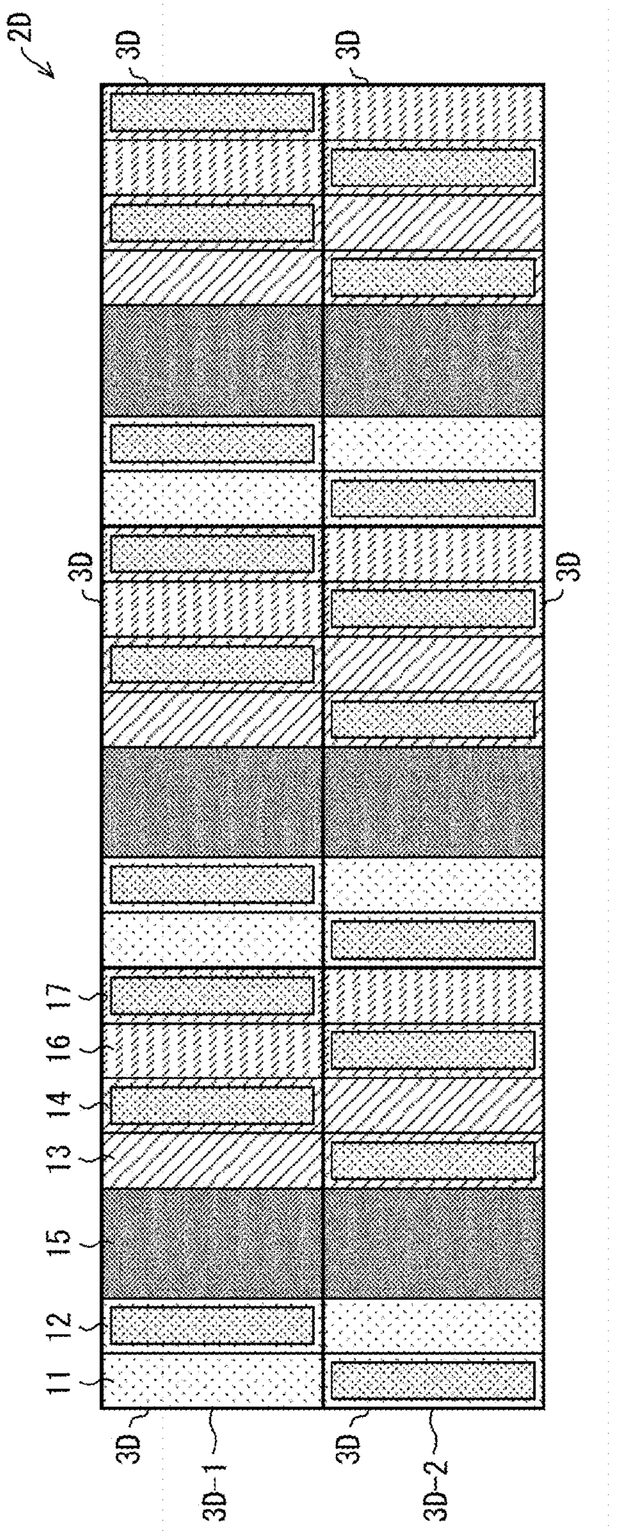
FIG. 16 is a diagram illustrating a configuration of each of pixels provided in a light-emitting device according to a fifth embodiment of the disclosure.

FIG. 16 is a diagram illustrating a configuration of each of pixels 3D provided in a light-emitting device 2D according to a fifth embodiment of the disclosure. The light-emitting device 2D according to the present embodiment includes a plurality of pixels 3D disposed on a plane. Similarly to the pixel 3C according to the fourth embodiment, the pixel 3D includes a first R subpixel 11, a second R subpixel 12, a first G subpixel 13, a second G subpixel 14, a B subpixel 15, a first Y subpixel 16, and a second Y subpixel 17. Note that, however, in the pixel 3D, the shape and the disposition of each of the subpixels are different from those in the pixel 3C according to the fourth embodiment.

Since an adjacency relationship of the pixels 3D in the present embodiment is the same as the adjacency relationship of the pixels 3C in the fourth embodiment, detailed description thereof will be omitted. In the present embodiment, "adjacency of pixels 3D" means that two different pixels 3D share at least part of a boundary line defining the pixels 3D. The adjacency relationship of each of the subpixels in the present embodiment is different from the adjacency relationship of each of the subpixels in the fourth embodiment. In the present embodiment, "adjacency of subpixels" means that two different subpixels share at least part of a boundary line defining the pixel 3D or any of the subpixels.

As illustrated in FIG. 16, all of the seven subpixels are disposed to be aligned in a row in the pixel 3D. In a first pixel 3D-1 included in an odd-numbered row of the light-emitting device 2D, the first R subpixel 11, the second R subpixel 12, the B subpixel 15, the first G subpixel 13, the second G subpixel 14, the first Y subpixel 16, and the second Y subpixel 17 are disposed to be aligned in this order. In a second pixel 3D-2 included in an even-numbered row of the light-emitting device 2D, the second R subpixel 12, the first R subpixel 11, the B subpixel 15, the second G subpixel 14, the first G subpixel 13, the second Y subpixel 17, and the first Y subpixel 16 are disposed to be aligned in this order. The second pixel 3D-2 may be included in an odd-numbered row of the light-emitting device 2D, and the first pixel 3D-1 may be included in an even-numbered row of the light-emitting device 2D.

In the pixel 3D, the first R subpixel 11 is adjacent to subpixels other than another first R subpixel 11, the first G subpixel 13, and the first Y subpixel 16. In the example of FIG. 16, in the pixel 3D-1, the first R subpixel 11 is adjacent to the second R subpixel 12 and the second Y subpixel 17, and is adjacent to none of the first G subpixel 13, the second G subpixel 14, the B subpixel 15, and the first Y subpixel 16. On the other hand, in the pixel 3D-2, the first R subpixel 11 is adjacent to the second R subpixel 12 and the B subpixel 15, and is adjacent to none of the first G subpixel 13, the second G subpixel 14, the first Y subpixel 16, and the second Y subpixel 17.

In the pixel 3D, the second R subpixel 12 is adjacent to subpixels other than another second R subpixel 12, the second G subpixel 14, and the second Y subpixel 17. In the example of FIG. 16, in the pixel 3D-1, the second R subpixel 12 is adjacent to the first R subpixel 11 and the B subpixel 15, and is adjacent to none of the first G subpixel 13, the second G subpixel 14, the first Y subpixel 16, and the second Y subpixel 17. On the other hand, in the pixel 3D-2, the second R subpixel 12 is adjacent to the first R subpixel 11 and the first Y subpixel 16, and is adjacent to none of the first G subpixel 13, the second G subpixel 14, the B subpixel 15, and the second Y subpixel 17.

In the pixel 3D, the first G subpixel 13 is adjacent to subpixels other than another first G subpixel 13, the first R subpixel 11, and the first Y subpixel 16. In the example of FIG. 16, in the pixel 3D-1, the first G subpixel 13 is adjacent to the second G subpixel 14 and the B subpixel 15, and is adjacent to none of the first R subpixel 11, the second R subpixel 12, the first Y subpixel 16, and the second Y subpixel 17. On the other hand, in the pixel 3D-2, the first G subpixel 13 is adjacent to the second G subpixel 14 and the second Y subpixel 17, and is adjacent to none of the first R subpixel 11, the second R subpixel 12, the B subpixel 15, and the first Y subpixel 16.

In the pixel 3D, the second G subpixel 14 is adjacent to subpixels other than another second G subpixel 14, the second R subpixel 12, and the second Y subpixel 17. In the example of FIG. 16, in the pixel 3D-1, the second G subpixel 14 is adjacent to the first G subpixel 13 and the first Y subpixel 16, and is adjacent to none of the first R subpixel 11, the second R subpixel 12, the B subpixel 15, and the second Y subpixel 17. On the other hand, in the pixel 3D-2, the second G subpixel 14 is adjacent to the first G subpixel 13 and the B subpixel 15, and is adjacent to none of the first R subpixel 11, the second R subpixel 12, the first Y subpixel 16, and the second Y subpixel 17.

In the pixel 3D, the first Y subpixel 16 is adjacent to subpixels other than another first Y subpixel 16, the first R subpixel 11, and the first G subpixel 13. In the example of FIG. 16, in the pixel 3D-1, the first Y subpixel 16 is adjacent to the second G subpixel 14 and the second Y subpixel 17, and is adjacent to none of the first R subpixel 11, the second R subpixel 12, the B subpixel 15, and the first G subpixel 13. On the other hand, in the pixel 3D-2, the first Y subpixel 16 is adjacent to the second Y subpixel 17 and the second R subpixel 12, and is adjacent to none of the first R subpixel 11, the B subpixel 15, the first G subpixel 13, and the second G subpixel 14.

In the pixel 3D, the second Y subpixel 17 is adjacent to subpixels other than another second Y subpixel 17, the second R subpixel 12, and the second G subpixel 14. In the example of FIG. 16, in the pixel 3D-1, the second Y subpixel 17 is adjacent to the first Y subpixel 16 and the first R subpixel 11, and is adjacent to none of the second R subpixel 12, the B subpixel 15, the first G subpixel 13, and the second G subpixel 14. On the other hand, in the pixel 3D-2, the second Y subpixel 17 is adjacent to the first G subpixel 13 and the first Y subpixel 16, and is adjacent to none of the first R subpixel 11, the second R subpixel 12, the B subpixel 15, and the second G subpixel 14.

In the light-emitting device 2D illustrated in FIG. 16, the first R subpixel 11, the first G subpixel 13, the B subpixel 15, and the first Y subpixel 16 emit light at the display surface 10. Further, the second R subpixel 12, the second G subpixel 14, the B subpixel 15, and the second Y subpixel 17 emit light at the display surface 20. Accordingly, similar to the light-emitting device 2C according to the fourth embodiment, the light-emitting device 2D can display the same information on both the display surface 10 and the display surface 20.

Advantageous Effects by Disposition of Each Subpixel

As illustrated in FIG. 16, in the pixel 3D, similarly to the pixel 3A depicted in FIG. 9, it is unnecessary to form a bank for separating the first R subpixel 11 and the second R subpixel 12 from each other. Further, similarly to the pixel 3A depicted in FIG. 9, it is unnecessary to form a bank for separating the first G subpixel 13 and the second G subpixel 14 from each other. As a result, the light-emitting device 2D including the pixels 3D may be more easily manufactured.

As illustrated in FIG. 16, in the pixel 3D, the first Y subpixel 16 and the second Y subpixel 17 are adjacent to each other. Accordingly, a first Y light-emitting layer 26 of the first Y subpixel 16 and a second Y light-emitting layer 27 of the second Y subpixel 17 are made to be a common layer. In other words, one Y light-emitting layer including the first Y light-emitting layer 26 and the second Y light-emitting layer 27 is disposed across the first Y subpixel 16 and the second Y subpixel 17. With this, since it is unnecessary to form a bank for separating the first Y subpixel 16 and the second Y subpixel 17 from each other, the light-emitting device 2D may be more easily manufactured.

As illustrated in FIG. 16, in the light-emitting device 2D, similarly to the light-emitting device 2B depicted in FIG. 12, it is unnecessary to form a bank for separating the first R subpixel 11 in the pixel 3D-1 from the second R subpixel 12 in the pixel 3D-2. Furthermore, it is unnecessary to form a bank for separating the second R subpixel 12 in the pixel 3D-1 from the first R subpixel 11 in the pixel 3D-2. As a result, the light-emitting device 2D may be more easily manufactured.

As illustrated in FIG. 16, in the light-emitting device 2D, similarly to the light-emitting device 2B depicted in FIG. 12, it is unnecessary to form a bank for separating the first G subpixel 13 in the pixel 3D-1 from the second G subpixel 14 in the pixel 3D-2. Furthermore, it is unnecessary to form a bank for separating the second G subpixel 14 in the pixel 3D-1 from the first G subpixel 13 in the pixel 3D-2. As a result, the light-emitting device 2D may be more easily manufactured.

As illustrated in FIG. 16, the first Y subpixel 16 in the pixel 3D-1 is adjacent to the second Y subpixel 17 in the pixel 3D-2 adjacent to and under the pixel 3D-1. Further, the second Y subpixel 17 in the pixel 3D-1 is adjacent to the first Y subpixel 16 in the pixel 3D-2 adjacent to and under the pixel 3D. Accordingly, the first Y light-emitting layers 26 in each of the first Y subpixels 16 in each of the pixels 3D for one column constituting the light-emitting device 2D, and the second Y light-emitting layers 27 in each of the second Y subpixels 17 in each of the pixels 3D for the above one column are all made to be a common layer. That is, one Y light-emitting layer is disposed across each of the pixels 3D in one column. This makes it unnecessary to form a bank for separating the first Y subpixel 16 in the pixel 3D-1 from the second Y subpixel 17 in the pixel 3D-2. Furthermore, it is unnecessary to form a bank for separating the second Y subpixel 17 in the pixel 3D-1 from the first Y subpixel 16 in the pixel 3D-2. As a result, the light-emitting device 2D may be more easily manufactured.

As illustrated in FIG. 16, the first R subpixel 11 is adjacent to subpixels other than another first R subpixel 11, the first G subpixel 13, and the first Y subpixel 16. The first G subpixel 13 is adjacent to subpixels other than another first G subpixel 13, the first R subpixel 11, and the first Y subpixel 16. The first Y subpixel 16 is adjacent to subpixels other than another first Y subpixel 16, the first R subpixel 11, and the first G subpixel 13. Accordingly, in the pixel 3D, the first R subpixel 11 having a reflective electrode 31 disposed on the display surface 20 side is not adjacent to the first G subpixel 13 having a reflective electrode 33 disposed on the display surface 20 side, and is also not adjacent to the first Y subpixel 16 having a reflective electrode 36 disposed on the display surface 20 side. In addition, the first G subpixel 13 and the first Y subpixel 16 are not adjacent to each other.

As illustrated in FIG. 16, the second R subpixel 12 is adjacent to subpixels other than another second R subpixel 12, the second G subpixel 14, and the second Y subpixel 17. The second G subpixel 14 is adjacent to subpixels other than another second G subpixel 14, the second R subpixel 12, and the second Y subpixel 17. The second Y subpixel 17 is adjacent to subpixels other than another second Y subpixel 17, the second R subpixel 12, and the second G subpixel 14. Accordingly, in the pixel 3D, the second R subpixel 12 having a reflective electrode 32 disposed on the display surface 10 side is not adjacent to the second G subpixel 14 having a reflective electrode 34 disposed on the display surface 10 side, and is also not adjacent to the second Y subpixel 17 having a reflective electrode 37 on the display surface 10 side. The second G subpixel 14 and the second Y subpixel 17 are not adjacent to each other.

Since the light-emitting device 2D employs the arrangement as illustrated in FIG. 16, the light-emitting device 2D does not have a region where pixels that are not displayed are continuously arranged on any of the display surface 10 side and the display surface 20 side. That is, the light-emitting device 2D includes a plurality of pixels 3D, in which the reflective electrodes of each of the subpixels are not continuously arranged on the display surface 10 side or the display surface 20 side, and each of the subpixels is arranged in a planar form. Thus, the light-emitting device 2D can display a smooth image or the like on both the display surface 10 and the display surface 20.

Area of Each Subpixel

As illustrated in FIG. 16, the first R subpixel 11, the second R subpixel 12, the first G subpixel 13, the second G subpixel 14, the first Y subpixel 16, and the second Y subpixel 17 have the same rectangular shape. In these subpixels, the length of the long side is approximately four times the length of the short side. As illustrated in FIG. 16, the B subpixel 15 has a rectangular shape. In the B subpixel 15, the length of the long side is twice the length of the short side. The length of the short side of the B subpixel 15 is approximately twice the length of each side of the first R subpixel 11, the second R subpixel 12, the first G subpixel 13, the second G subpixel 14, the first Y subpixel 16, and the second Y subpixel 17. Each of the subpixels is adjacent to each other in such a manner that each long side portion thereof is in contact with each other. For example, the first R subpixel 11 and the second R subpixel 12 are adjacent to each other in such a manner that a long side portion of the first R subpixel 11 and a long side portion of the second R subpixel 12 are in contact with each other.

In the present embodiment, the first R subpixel 11, the second R subpixel 12, the first G subpixel 13, the second G subpixel 14, the first Y subpixel 16, and the second Y subpixel 17 have the same area in size. On the other hand, the area of the B subpixel 15 is twice the area of each of the first R subpixel 11, the second R subpixel 12, the first G subpixel 13, the second G subpixel 14, the first Y subpixel 16, and the second Y subpixel 17. Accordingly, similar to the light-emitting device 2C illustrated in FIG. 13, the light-emitting device 2D can display information on both the display surface 10 and the display surface 20 by a normal current drive without losing the balance of RGYB colors of information.

The area of the B subpixel 15 may be twice or more the area of each of the first R subpixel 11, the second R subpixel 12, the first G subpixel 13, the second G subpixel 14, the first Y subpixel 16, and the second Y subpixel 17. With this, the B light-emitting layer 25 having low luminous efficiency can be driven by a relatively low current.

Sixth Embodiment

Figure 17:
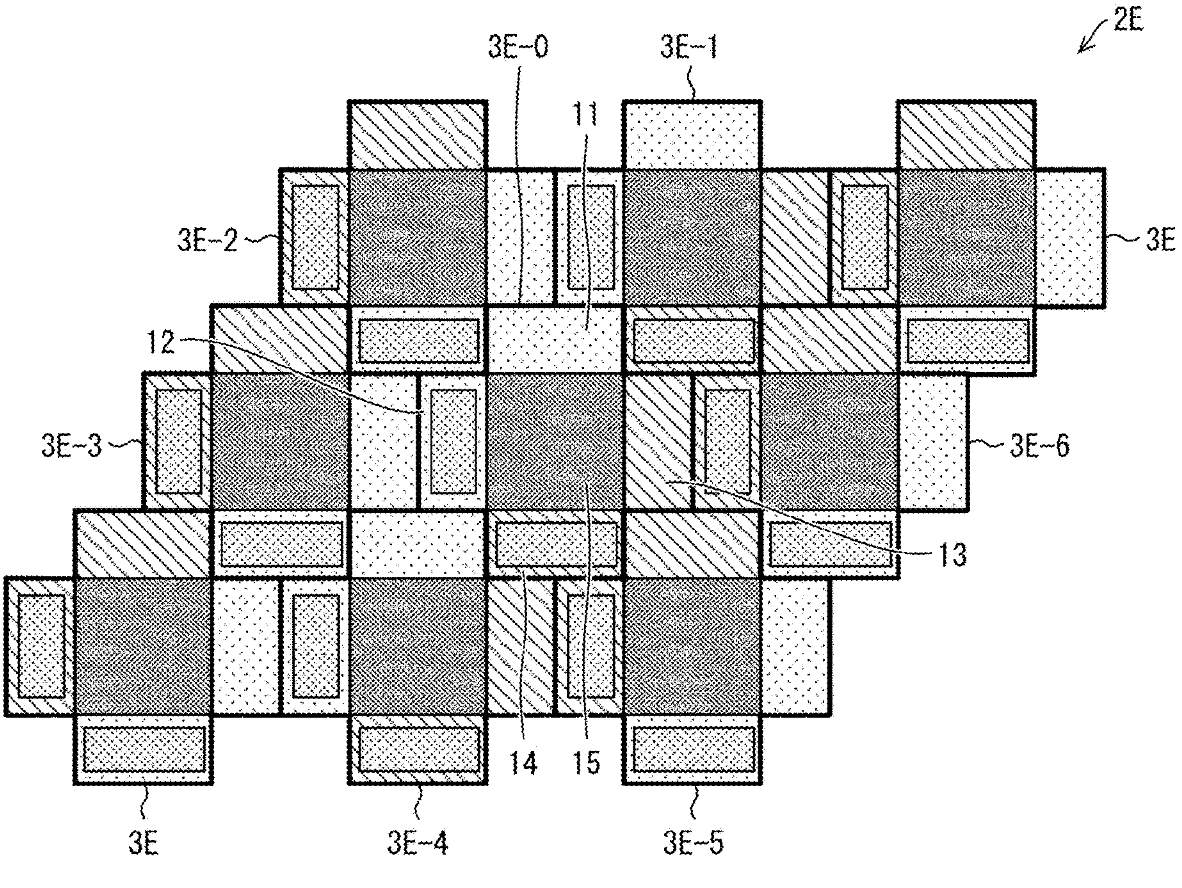
FIG. 17 is a diagram illustrating a configuration of each of pixels provided in a light-emitting device according to a sixth embodiment of the disclosure.

FIG. 17 is a diagram illustrating a configuration of each of pixels 3E provided in a light-emitting device 2E according to a sixth embodiment of the disclosure. The light-emitting device 2E according to the present embodiment includes a plurality of pixels 3E. Similarly to the pixel 3 according to the first embodiment, the pixel 3E includes a first R subpixel 11, a second R subpixel 12, a first G subpixel 13, a second G subpixel 14, and a B subpixel 15. However, the disposition of each of the subpixels in the pixel 3E is different from that in the pixel 3.

To be specific, in the pixel 3E, the first R subpixel 11, the second R subpixel 12, the first G subpixel 13, and the second G subpixel 14 are respectively disposed on the upper, left, right, and lower sides of the B subpixel 15. The B subpixel 15 is adjacent to all of the other four subpixels. In the embodiment, "adjacency of subpixels" means that two different subpixels share at least part of a boundary line defining the pixel 3E or any of the subpixels. The first R subpixel 11 faces the second G subpixel 14 across the B subpixel 15. The second R subpixel 12 faces the first G subpixel 13 across the B subpixel 15.

The B subpixel 15 has a square shape. Each of the first R subpixel 11, the second R subpixel 12, the first G subpixel 13, and the second G subpixel 14 has a rectangular shape. The length of each long side of the first R subpixel 11, the second R subpixel 12, the first G subpixel 13, and the second G subpixel 14 is twice the length of each short side thereof. Accordingly, the area of the B subpixel 15 is twice the area of each of the other four subpixels. The first R subpixel 11, the second R subpixel 12, the first G subpixel 13, and the second G subpixel 14 are each adjacent to the B subpixel 15 at each long side portion.

As illustrated in FIG. 17, in the present embodiment, a certain pixel 3E is adjacent to the other six pixels 3E. In the present embodiment, "adjacency of pixels 3E" means that two different pixels 3E share at least part of a boundary line defining the pixels 3E.

Specifically, a certain pixel 3E-0 is the pixel 3E depicted in the center of FIG. 17. In FIG. 17, a first pixel 3E-1 is adjacent to the upper right of the certain pixel 3E-0, a second pixel 3E-2 is adjacent to the upper left of the certain pixel 3E-0, and a third pixel 3E-3 is adjacent to the left of the certain pixel 3E-0. Further, a fourth pixel 3E-4 is adjacent to the lower left of the certain pixel 3E-0, a fifth pixel 3E-5 is adjacent to the lower right of the certain pixel 3E-0, and a sixth pixel 3E-6 is adjacent to the right of the certain pixel 3E-0.

As illustrated in FIG. 17, the first R subpixel 11 in the certain pixel 3E-0 is adjacent to the second R subpixel 12 and the second G subpixel 14 in the first pixel 3E-1 adjacent to the certain pixel 3E-0, and the first R subpixel 11 and the second R subpixel 12 in the second pixel 3E-2 adjacent to the certain pixel 3E-0. The second R subpixel 12 in the certain pixel 3E-0 is adjacent to the second R subpixel 12 in the second pixel 3E-2 adjacent to the certain pixel 3E-0, the first R subpixel 11 in the third pixel 3E-3 adjacent to the certain pixel 3E-0, and the first R subpixel 11 in the fourth pixel 3E-4 adjacent to the certain pixel 3E-0.

Further, the second G subpixel 14 in the certain pixel 3E-0 is adjacent to the first G subpixel 13 and the first R subpixel 11 in the fourth pixel 3E-4 adjacent to the certain pixel 3E-0, and the first G subpixel 13 and the second G subpixel 14 in the fifth pixel 3E-5 adjacent to the certain pixel 3E-0. The first G subpixel 13 in the certain pixel 3E-0 is adjacent to the second G subpixel 14 in the first pixel 3E-1 adjacent to the certain pixel 3E-0, the first G subpixel 13 in the fifth pixel 3E-5 adjacent to the certain pixel 3E-0, and the second G subpixel 14 in the sixth pixel 3E-6 adjacent to the certain pixel 3E-0.

Main Effects

In the light-emitting device 2E according to the present embodiment, the first R subpixels 11 and the second R subpixels 12 included in the plurality of pixels 3E continuously disposed in an oblique direction are continuously disposed in the oblique direction. With this, a first R light-emitting layer 21 and a second R light-emitting layer 22 in each pixel 3E are made to be a common layer. Accordingly, a formation area of the R light-emitting layers continuously disposed in the light-emitting device 2 is larger than a formation area of the R light-emitting layers continuously disposed in the light-emitting device 2E according to the modified example of the first embodiment. Thus, since the R light-emitting layers having a larger area can be formed at a time when the light-emitting device 2E is manufactured, the light-emitting device 2E can be more easily manufactured.

In the light-emitting device 2E according to the present embodiment, the first G subpixels 13 and the second G subpixels 14 included in the plurality of pixels 3E continuously disposed in an oblique direction are continuously disposed in the oblique direction. With this, a first G light-emitting layer 23 and a second G light-emitting layer 24 in each pixel 3E are made to be a common layer. Accordingly, a formation area of the G light-emitting layers continuously disposed in the light-emitting device 2E is larger than a formation area of the G light-emitting layers continuously disposed in the light-emitting device 2 according to the modified example of the first embodiment. Thus, since the G light-emitting layers having a larger area can be formed at a time when the light-emitting device 2E is manufactured, the light-emitting device 2E can be more easily manufactured.

In the light-emitting device 2E, a long side portion of a certain first R subpixel 11 and a short side portion of another first R subpixel 11 are adjacent to each other. Accordingly, on the display surface 10 of the light-emitting device 2E, with respect to the entirety of a certain reflective electrode 31, half of the entirety of another reflective electrode 31 is adjacent. That is, on the display surface 10, the area of a region in which two reflective electrodes 31 are continuously disposed is smaller than that in the case where two reflective electrodes 31 are entirely adjacent to each other. This makes it possible to further reduce the area of a region where red light is not emitted on the display surface 10 side.

Further, in the light-emitting device 2E, a long side portion of a certain second R subpixel 12 and a short side portion of another second R subpixel 12 are adjacent to each other. Accordingly, on the display surface 20 of the light-emitting device 2E, with respect to the entirety of a certain reflective electrode 32, half of the entirety of another reflective electrode 32 is adjacent. That is, on the display surface 20, the area of a region in which two reflective electrodes 32 are continuously disposed is smaller than that in the case where the two reflective electrodes 32 are entirely adjacent to each other. This makes it possible to further reduce the area of a region where red light is not emitted on the display surface 20 side.

Further, in the light-emitting device 2E, a long side portion of a certain first G subpixel 13 and a short side portion of another first G subpixel 13 are adjacent to each other. Accordingly, on the display surface 10 of the light-emitting device 2E, with respect to the entirety of a certain reflective electrode 33, half of the entirety of another reflective electrode 33 is adjacent. That is, on the display surface 10, the area of a region in which two reflective electrodes 33 are continuously disposed is smaller than that in the case where the two reflective electrodes 33 are entirely adjacent to each other. This makes it possible to further reduce the area of a region where green light is not emitted on the display surface 10 side.

Further, in the light-emitting device 2E, a long side portion of a certain second G subpixel 14 and a short side portion of another second G subpixel 14 are adjacent to each other. Accordingly, on the display surface 20 of the light-emitting device 2E, with respect to the entirety of a certain reflective electrode 34, half of the entirety of another reflective electrode 34 is adjacent. That is, on the display surface 20, the area of a region in which two reflective electrodes 34 are continuously disposed is smaller than that in the case where the two reflective electrodes 34 are entirely adjacent to each other. This makes it possible to further reduce the area of a region where green light is not emitted on the display surface 20 side.

As described above, the light-emitting device 2E can display a smoother image or the like than in the case where two reflective electrodes are entirely adjacent to each other.

Seventh Embodiment

Figure 18:
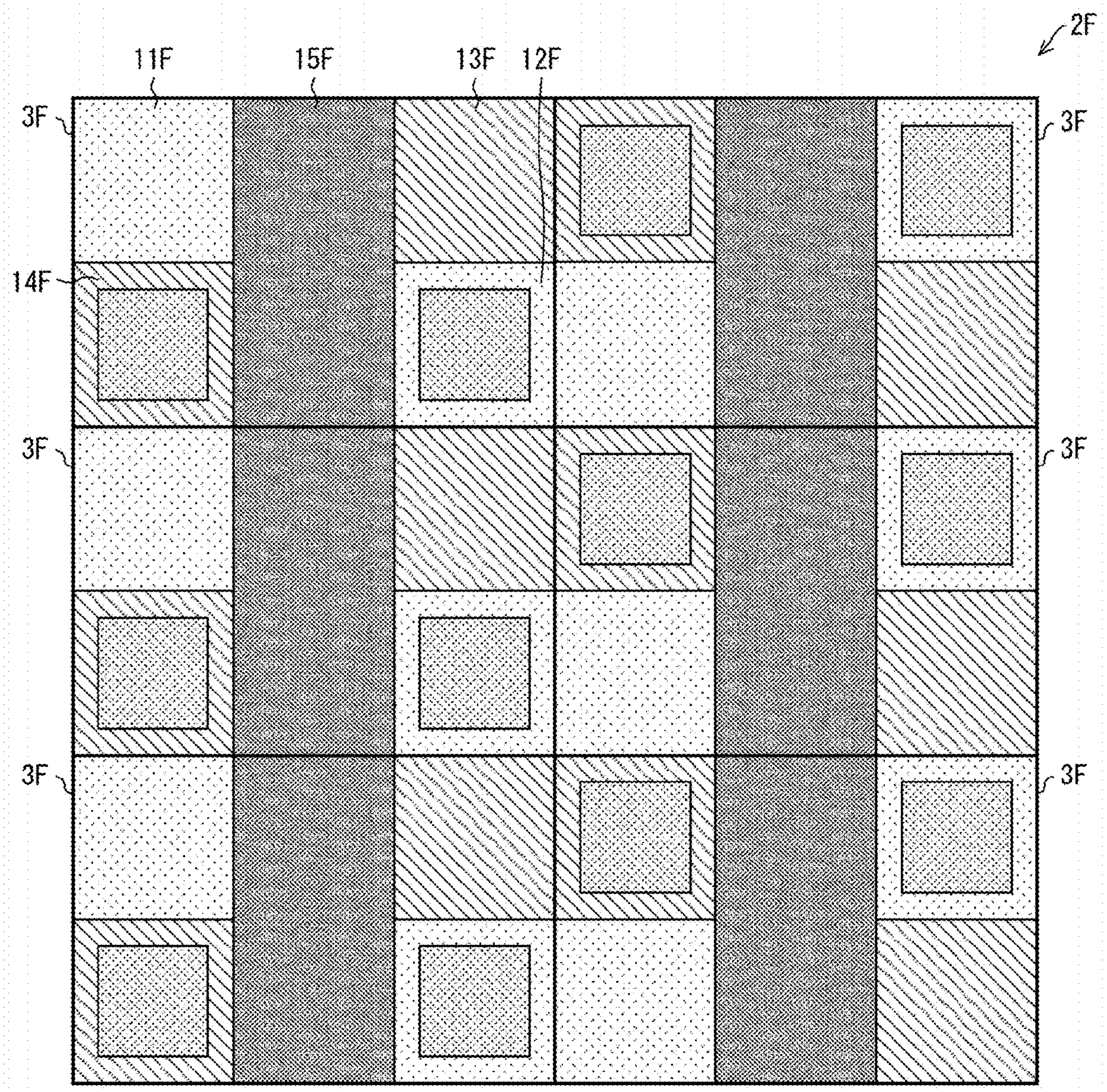
FIG. 18 is a diagram illustrating a configuration of each of pixels provided in a light-emitting device according to a seventh embodiment of the disclosure.
Figure 19:
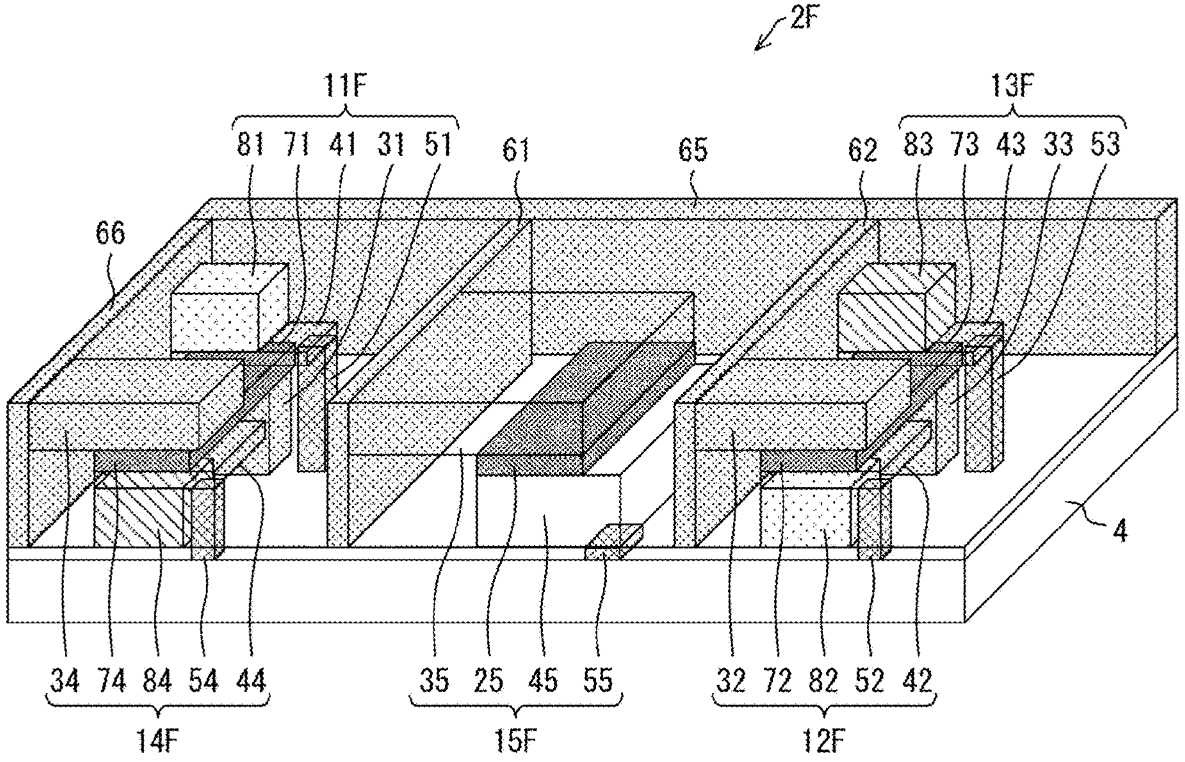
FIG. 19 is a bird's-eye view illustrating a configuration of an interior of a pixel according to the seventh embodiment of the disclosure.

FIG. 18 is a diagram illustrating a configuration of each of pixels 3F provided in a light-emitting device 2F according to a seventh embodiment of the disclosure. FIG. 19 is a bird's-eye view illustrating a configuration of an interior of a pixel 3F according to the seventh embodiment of the disclosure. The light-emitting device 2F according to the present embodiment includes a plurality of pixels 3F disposed in a planar form. The pixel 3F includes a first R subpixel 11F, a second R subpixel 12F, a first G subpixel 13F, a second G subpixel 14F, and a B subpixel 15F.

Since an adjacency relationship of each of the pixels 3F in the present embodiment is the same as the adjacency relationship of the pixels 3 in the first embodiment, detailed description thereof will be omitted. In the present embodiment, "adjacency of pixels 3F" means that two different pixels 3F share at least part of a boundary line defining the pixels 3F. Since the adjacency relationship of each of the subpixels in the present embodiment is the same as the adjacency relationship of each of the subpixels in the first embodiment, detailed description thereof will be omitted. In the present embodiment, "adjacency of subpixels" means that two different subpixels share at least part of a boundary line defining the pixel 3F or any of the subpixels.

In the pixel 3F, the internal structure of each of the subpixels is different from that in the pixel 3 according to the first embodiment. Further, the pixel 3F is different from the pixel 3 according to the first embodiment in that the emission of red and green light is not EL light emission excited by current injection, but PL light emission excited by excitation light emitted from an excitation layer. In the present embodiment, an example in which the excitation light is blue light will be described. The pixel 3F is the same as the pixel 3 in that the B subpixel 15F emits blue light by EL.

First R Subpixel 11F

The first R subpixel 11F includes a reflective electrode 31, a transparent electrode 41, a TFT 51, an excitation layer 71 (first excitation layer), and a first R light-emitting layer 81 (first light-emitting layer). The reflective electrode 31 is disposed on the display surface 20 side. The excitation layer 71 is disposed on the display surface 10 side relative to the reflective electrode 31, and is excited by current injection to emit blue light by EL. The transparent electrode 41 is disposed on the display surface 10 side relative to the excitation layer 71. That is, the excitation layer 71 is disposed between the reflective electrode 31 and the transparent electrode 41.

The first R light-emitting layer 81 is disposed on the display surface 10 side relative to the transparent electrode 41, includes a first quantum dot, and is excited by the blue light emitted from the excitation layer 71 to emit red light by PL. It is sufficient for the first quantum dot to be any quantum dot capable of emitting red light. The reflective electrode 31 and the TFT 51 are both disposed on the substrate 4. The TFT 51 is connected to the transparent electrode 41 and is used for injecting a current into the excitation layer 71 through the transparent electrode 41.

Second R Subpixel 12F

The second R subpixel 12F includes a reflective electrode 32, a transparent electrode 42, a TFT 52, an excitation layer 72 (second excitation layer), and a second R light-emitting layer 82 (second light-emitting layer). The reflective electrode 32 is disposed on the display surface 10 side. The excitation layer 72 is disposed on the display surface 20 side relative to the reflective electrode 32, and is excited by current injection to emit blue light by EL. The transparent electrode 42 is disposed on the display surface 20 side relative to the excitation layer 72. That is, the excitation layer 72 is disposed between the reflective electrode 32 and the transparent electrode 42.

The second R light-emitting layer 82 is disposed on the display surface 20 side relative to the transparent electrode 42, includes a second quantum dot, and is excited by the blue light emitted from the excitation layer 72 to emit red light by PL. It is sufficient for the second quantum dot to be any quantum dot capable of emitting red light. The second R light-emitting layer 82 and the TFT 52 are both disposed on the substrate 4. The TFT 52 is connected to the transparent electrode 42 and is used for injecting a current into the excitation layer 72 through the transparent electrode 42.

First G Subpixel 13F

The first G subpixel 13F includes a reflective electrode 33, a transparent electrode 43, a TFT 53, an excitation layer 73 (third excitation layer), and a first G light-emitting layer 83 (third light-emitting layer). The reflective electrode 33 is disposed on the display surface 20 side. The excitation layer 73 is disposed on the display surface 10 side relative to the reflective electrode 33, and is excited by current injection to emit blue light by EL. The transparent electrode 43 is disposed on the display surface 10 side relative to the excitation layer 73. That is, the excitation layer 73 is disposed between the reflective electrode 33 and the transparent electrode 43.

The first G light-emitting layer 83 is disposed on the display surface 10 side relative to the transparent electrode 43, includes a third quantum dot, and is excited by the blue light emitted from the excitation layer 73 to emit green light by PL. It is sufficient for the third quantum dot to be any quantum dot capable of emitting green light. The reflective electrode 33 and the TFT 53 are both disposed on the substrate 4. The TFT 53 is connected to the transparent electrode 43 and is used for injecting a current into the excitation layer 73 through the transparent electrode 43.

Second G Subpixel 14F

The second G subpixel 14F includes a reflective electrode 34, a transparent electrode 44, a TFT 54, an excitation layer 74 (fourth excitation layer), and a second G light-emitting layer 84 (fourth light-emitting layer). The reflective electrode 34 is disposed on the display surface 20 side. The excitation layer 74 is disposed on the display surface 10 side relative to the reflective electrode 34, and is excited by current injection to emit blue light by EL. The transparent electrode 44 is disposed on the display surface 10 side relative to the excitation layer 74. That is, the excitation layer 74 is disposed between the reflective electrode 34 and the transparent electrode 44.

The second G light-emitting layer 84 is disposed on the display surface 10 side relative to the transparent electrode 44, includes the third quantum dot, and is excited by the blue light emitted from the excitation layer 74 to emit green light by PL. It is sufficient for the third quantum dot to be any quantum dot capable of emitting green light. The reflective electrode 34 and the TFT 54 are both disposed on the substrate 4. The TFT 54 is connected to the transparent electrode 44 and is used for injecting a current into the excitation layer 74 through the transparent electrode 44.

Since the configuration of the B subpixel 15F is the same as that of the B subpixel 15 according to the first embodiment, detailed description thereof will be omitted.

The thickness of the first R light-emitting layer 81 is sufficiently greater than the thickness of the first R light-emitting layer 31 according to the first embodiment. This makes it possible for the first R light-emitting layer 81 to sufficiently absorb blue light emitted from the excitation layer 71 and emit red light with sufficiently high luminance by PL. The thickness of the reflective electrode 32 disposed in the same layer as the first R light-emitting layer 81 is greater than the thickness of the reflective electrodes 31 according to the first embodiment in accordance with the thickness of the first R light-emitting layer 81.

Likewise, the thickness of the second R light-emitting layer 82 is sufficiently greater than the thickness of the second R light-emitting layer 32 according to the first embodiment. This makes it possible for the second R light-emitting layer 82 to sufficiently absorb blue light emitted from the excitation layer 72 and emit red light with sufficiently high luminance by PL. The thickness of the reflective electrode 33 disposed in the same layer as the second R light-emitting layer 82 is greater than the thickness of the reflective electrodes 33 according to the first embodiment in accordance with the thickness of the second R light-emitting layer 82.

Likewise, the thickness of the first G light-emitting layer 83 is sufficiently greater than the thickness of the first G light-emitting layer 33 according to the first embodiment. This makes it possible for the first G light-emitting layer 83 to sufficiently absorb blue light emitted from the excitation layer 73 and emit green light with sufficiently high luminance by PL. The thickness of the reflective electrode 32 disposed in the same layer as the first G light-emitting layer 83 is greater than the thickness of the reflective electrodes 32 according to the first embodiment in accordance with the thickness of the first G light-emitting layer 83.

Likewise, the thickness of the second G light-emitting layer 84 is sufficiently greater than the thickness of the second G light-emitting layer 34 according to the first embodiment. This makes it possible for the second G light-emitting layer 84 to sufficiently absorb blue light emitted from the excitation layer 74 and emit green light with sufficiently high luminance by PL. The thickness of the reflective electrode 31 disposed in the same layer as the second G light-emitting layer 84 is greater than the thickness of the reflective electrodes 31 according to the first embodiment in accordance with the thickness of the second G light-emitting layer 84.

Light Emission Direction of Light

The excitation layer 71 of the first R subpixel 11F is excited by current injection and emits blue light. This blue light travels toward both the display surface 10 side and the display surface 20 side. The blue light traveling toward the display surface 20 is reflected by the reflective electrode 31 disposed on the display surface 20 side, and then travels toward the display surface 10 side. Accordingly, the blue light emitted from the excitation layer 71 does not pass through the display surface 20, but passes through the transparent electrode 41 and enters the first R light-emitting layer 81.

The first R light-emitting layer 81 is excited by the blue light emitted from the excitation layer 71 to emit red light. This red light travels toward both the display surface 10 side and the display surface 20 side. The red light traveling toward the display surface 20 side is reflected by the reflective electrode 31 disposed on the display surface 20 side, and then travels toward the display surface 10 side. Accordingly, the red light emitted from the first R light-emitting layer 81 does not pass through the display surface 20, but passes through the display surface 10 and is emitted to the outside of the light-emitting device 2F. Thus, the first R subpixel 11F does not emit red light at the display surface 20 side, but emits red light only at the display surface 10 side.

The excitation layer 72 of the second R subpixel 12F is excited by current injection and emits blue light. This blue light travels toward both the display surface 10 side and the display surface 20 side. The blue light traveling toward the display surface 10 is reflected by the reflective electrode 32 disposed on the display surface 10 side, and then travels toward the display surface 20 side. Accordingly, the blue light emitted from the excitation layer 72 does not pass through the display surface 10, but passes through the transparent electrode 42 and enters the second R light-emitting layer 82.

The second R light-emitting layer 82 is excited by the blue light emitted from the excitation layer 72 to emit red light. This red light travels toward both the display surface 10 side and the display surface 20 side. The red light traveling toward the display surface 10 side is reflected by the reflective electrode 32 disposed on the display surface 10 side, and then travels toward the display surface 20 side. Accordingly, the red light emitted from the second R light-emitting layer 82 does not pass through the display surface 10, but passes through the substrate 4 and the display surface 20 to be emitted to the outside of the light-emitting device 2F. Thus, the second R subpixel 12F does not emit red light to the display surface 10 side, but emits red light only at the display surface 20 side.

The excitation layer 73 of the first G subpixel 13F is excited by current injection and emits blue light. This blue light travels toward both the display surface 10 side and the display surface 20 side. The blue light traveling toward the display surface 20 is reflected by the reflective electrode 33 disposed on the display surface 20 side, and then travels toward the display surface 10 side. Accordingly, the blue light emitted from the excitation layer 73 does not pass through the display surface 20, but passes through the transparent electrode 43 and enters the first G light-emitting layer 83.

The first G light-emitting layer 83 is excited by the blue light emitted from the excitation layer 73 to emit green light. This green light travels toward both the display surface 10 side and the display surface 20 side. The green light traveling toward the display surface 20 side is reflected by the reflective electrode 33 disposed on the display surface 20 side, and then travels toward the display surface 10 side. Accordingly, the green light emitted from the first G light-emitting layer 83 does not pass through the display surface 20, but passes through only the display surface 10 and is emitted to the outside of the light-emitting device 2F. Thus, the first G subpixel 13F does not emit green light to the display surface 20 side, but emits green light only at the display surface 10 side.

The excitation layer 74 of the second G subpixel 14F is excited by current injection and emits blue light. This blue light travels toward both the display surface 10 side and the display surface 20 side. The blue light traveling toward the display surface 10 is reflected by the reflective electrode 34 disposed on the display surface 10 side, and then travels toward the display surface 20 side. Accordingly, the blue light emitted from the excitation layer 74 does not pass through the display surface 10, but passes through the transparent electrode 44 and enters the second G light-emitting layer 84.

The second G light-emitting layer 84 is excited by the blue light emitted from the excitation layer 74 to emit green light. This green light travels toward both the display surface 10 side and the display surface 20 side. The green light traveling toward the display surface 10 side is reflected by the reflective electrode 34 disposed on the display surface 10 side, and then travels toward the display surface 20 side. Accordingly, the green light emitted from the second G light-emitting layer 84 does not pass through the display surface 10, but passes only through the substrate 4 and the display surface 20 to be emitted to the outside of the light-emitting device 2F. Thus, the second G subpixel 14F does not emit green light at the display surface 10 side, but emits green light only at the display surface 20 side.

B light-emitting layer 25 of the B subpixel 15F is excited by current injection and emits blue light. This blue light travels toward both the display surface 10 side and the display surface 20 side. The blue light traveling toward the display surface 10 side passes through the transparent electrode 35 disposed on the display surface 10 side. Accordingly, the blue light traveling toward the display surface 10 side passes through the display surface 10, and is emitted to the outside of the light-emitting device 2F. The blue light traveling toward the display surface 20 side passes through the transparent electrode 45 disposed on the display surface 20 side and the substrate 4. Accordingly, the blue light traveling toward the display surface 20 side passes through the display surface 20 and is emitted to the outside of the light-emitting device 2F.

As discussed above, in the B subpixel 15F, blue light emitted from the B light-emitting layer 25 passes through both the display surface 10 side and the display surface 20 side, and is emitted to the outside of the light-emitting device 2F. Thus, blue light with a luminance level of about half the total luminance of the blue light emitted from the B light-emitting layer 25 is emitted at each of the display surface 10 side and the display surface 20 side.

The pixel 3F further includes a bank 61, a bank 62, a bank 65, and a bank 66. The configurations of the banks 61, 62, 65, and 66 are the same as the configurations of the banks 61, 62, 65, and 66 according to the first embodiment, and therefore detailed description thereof will be omitted.

Main Effects

In the light-emitting device 2F, the method of emitting red and green light is different from the method in the light-emitting device 2 according to the first embodiment, but the light emission positions of red, green, and blue light are the same as those in the light-emitting device 2. Accordingly, the light-emitting device 2F is a double-sided light-emitting device able to display information on both the display surface 10 and the display surface 20. Further, in the light-emitting device 2F, the configuration of the B subpixel 15F is the same as that in the light-emitting device 2. Therefore, the light-emitting device 2F is a transparent light-emitting device in which the light-emitting device 2F itself is transparent.

In the light-emitting device 2F, the reflective electrode is disposed in each of the first R subpixel 11F, the second R subpixel 12F, the first G subpixel 13F, and the second G subpixel 14F. This makes it possible to prevent the light-emitting layers in the first R subpixel 11F, the second R subpixel 12F, the first G subpixel 13F, and the second G subpixel 14F from performing PL light emission caused by background light.

Even when the B light-emitting layer 25 in the B subpixel 15F includes a quantum dot, the B light-emitting layer 25 does not emit blue light by PL unless it is irradiated with ultraviolet light. The light-emitting device 2F preferably includes a layer for blocking ultraviolet light on each of the display surface 10 and the display surface 20. This makes it possible to prevent the B light-emitting layer 25 from being irradiated with ultraviolet light, and therefore it is possible to prevent the B light-emitting layer 25 including the quantum dot from being excited by the ultraviolet light contained in the external light and emitting blue light by PL.

As described above, according to the present embodiment, the transmissive-type light-emitting device 2F is provided, in which information can be displayed on both the display surface 10 and the display surface 20 (both surfaces of the light-emitting device 2F), and unwanted PL light emission caused by the background light is not performed.

In the pixel 3F according to the present embodiment, similarly to the pixel 3 according to the first embodiment, the bank 61 and the bank 62 are each entirely constituted of a reflective electrode. This makes it possible to prevent the first R light-emitting layer 81 from being excited by blue light emitted from the B light-emitting layer 25 and emitting red light by PL in the first R subpixel 11F. It is also possible to prevent the second R light-emitting layer 82 from being excited by the blue light emitted from the B light-emitting layer 25 and emitting red light by PL in the second R subpixel 12F. Further, it is possible to prevent the first G light-emitting layer 83 from being excited by the blue light emitted from the B light-emitting layer 25 and emitting green light by PL in the first G subpixel 13F. Furthermore, it is possible to prevent the second G light-emitting layer 84 from being excited by the blue light emitted from the B light-emitting layer 25 and emitting green light by PL in the second G subpixel 14F.

The excitation light may be light other than blue light. Specifically, it is sufficient for the excitation light to be light having a shorter wavelength than the light emitted from the light-emitting layer of each of the subpixels. For example, the excitation light emitted from the excitation layer 71 of the first R subpixel 11F is required to be light (green light, ultraviolet light, or the like) having a shorter wavelength than the red light emitted from the first R light-emitting layer 81. Likewise, the excitation light emitted from the excitation layer 72 of the second R subpixel 12F is required to be light (green light, ultraviolet light, or the like) having a shorter wavelength than the red light emitted from the second R light-emitting layer 82. Further, the excitation light emitted from the excitation layer 73 of the first G subpixel 13F is required to be light (ultraviolet light or the like) having a shorter wavelength than the green light emitted from the first G light-emitting layer 83. Likewise, the excitation light emitted from the excitation layer 74 of the second G subpixel 14F is required to be light (ultraviolet light or the like) having a shorter wavelength than the green light emitted from the second G light-emitting layer 84.

Modified Example

The pixel 3F may further include a first Y subpixel and a second Y subpixel. The first Y subpixel according to the present example may have the same configuration as the first R subpixel 11F or first G subpixel 13F described above. The second Y subpixel according to the present example may have the same configuration as the second R subpixel 13F or second G subpixel 14F described above. The first Y subpixel emits yellow light (third color light) having a longer wavelength than blue light and being different from red and blue light at the display surface 10 side. The second Y subpixel emits yellow light at the display surface 20 side. The first Y subpixel includes a fifth opaque layer disposed on the display surface 20 side, and a first Y light-emitting layer (sixth light-emitting layer) disposed on the display surface 10 side relative to the fifth opaque layer and including a fifth quantum dot. The second Y subpixel includes a sixth opaque layer disposed on the display surface 10 side, and a second Y light-emitting layer disposed on the display surface 20 side relative to the sixth opaque layer and including the sixth quantum dot.

In the present example, the fifth opaque layer is a fifth opaque electrode. The fifth opaque electrode may be a fifth reflective electrode. The first Y subpixel further includes a fifth excitation layer that is disposed on the display surface 10 side relative to the fifth opaque electrode and is excited by current injection to emit excitation light (blue light, ultraviolet light, or the like) having a shorter wavelength than any of red, green, and yellow light, and includes a fifth transparent electrode disposed on the display surface 10 side relative to the fifth excitation layer. The first Y light-emitting layer is disposed on the display surface 10 side relative to a sixth transparent electrode, and is excited by the excitation light emitted from the fifth excitation layer to emit yellow light. The sixth opaque layer is a sixth opaque electrode. The sixth opaque electrode may be a sixth reflective electrode. The second Y subpixel further includes a sixth excitation layer that is disposed on the display surface 20 side relative to the sixth opaque electrode and is excited by current injection to emit excitation light, and includes the sixth transparent electrode disposed on the display surface 20 side relative to the sixth excitation layer. The second Y light-emitting layer is disposed on the display surface 20 side relative to the sixth transparent electrode, and is excited by the excitation light emitted from the sixth excitation layer to emit yellow light.

The light-emitting device 2F according to the present example emits red, green, blue, and yellow light to the display surface 10 side using the first R subpixel 11F, the first G subpixel 13F, the B subpixel 15F, and the first Y subpixel included in the pixel 3F. Accordingly, the light-emitting device 2F can display RGBY four-color information (an image or the like) on the display surface 10. Further, the light-emitting device 2F emits red, green, blue, and yellow light to the display surface 20 side using the second R subpixel 12F, the second G subpixel 14F, the B subpixel 15F, and the second Y subpixel included in the same pixel 3F. Accordingly, the light-emitting device 2F can display on the display surface 20 the same information (the image or the like) as the RGBY four-color information displayed on the display surface 10. Thus, the light-emitting device 2F according to the present example is a double-sided light-emitting device able to display the information, that is, the same information on both the display surface 10 and the display surface 20.

In the present example, the pixel 3F may include banks for separating the subpixels that emit light of different colors from each other among the first R subpixel 11F, the second R subpixel 12F, the first G subpixel 13F, the second G subpixel 14F, the B subpixel 15F, the first Y subpixel, and the second Y subpixel. At least part of the bank may be constituted by an opaque electrode. The opaque electrode constituting the bank may be connected to at least any of the fifth and sixth opaque electrodes.

Eighth Embodiment

Figure 20:
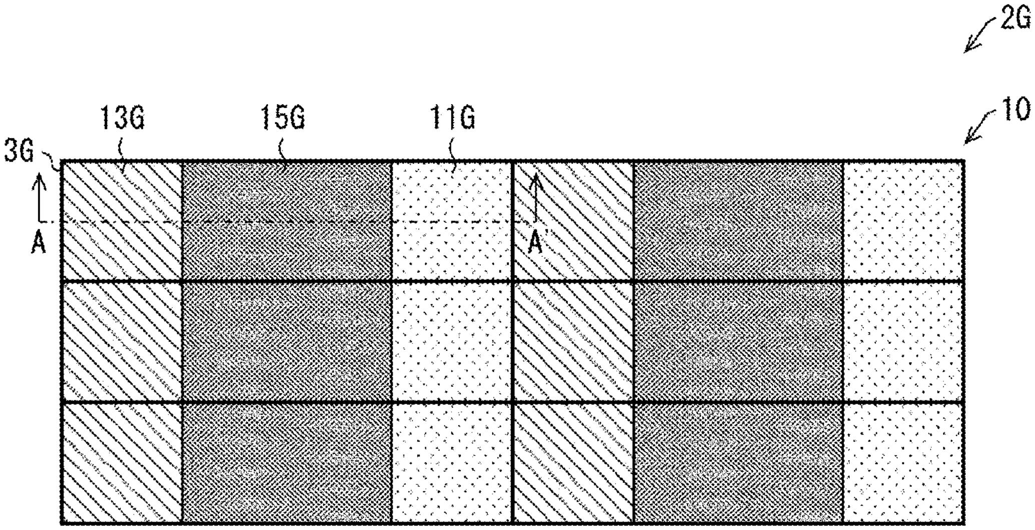
FIG. 20 is a diagram illustrating a configuration of each of pixels provided in a light-emitting device according to an eighth embodiment of the disclosure.
Figure 21:
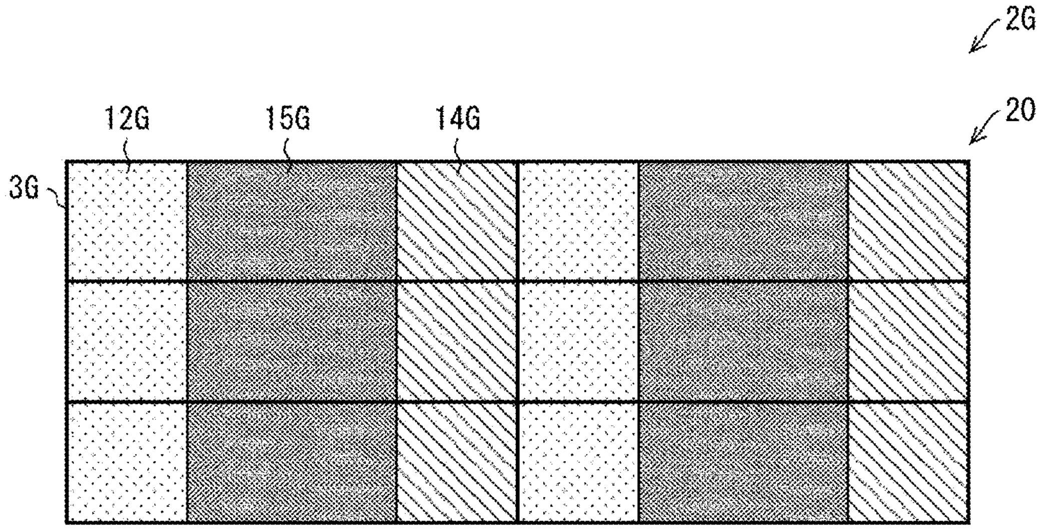
FIG. 21 is a diagram illustrating a configuration of each of pixels provided in a light-emitting device according to the eighth embodiment of the disclosure.
Figure 22:
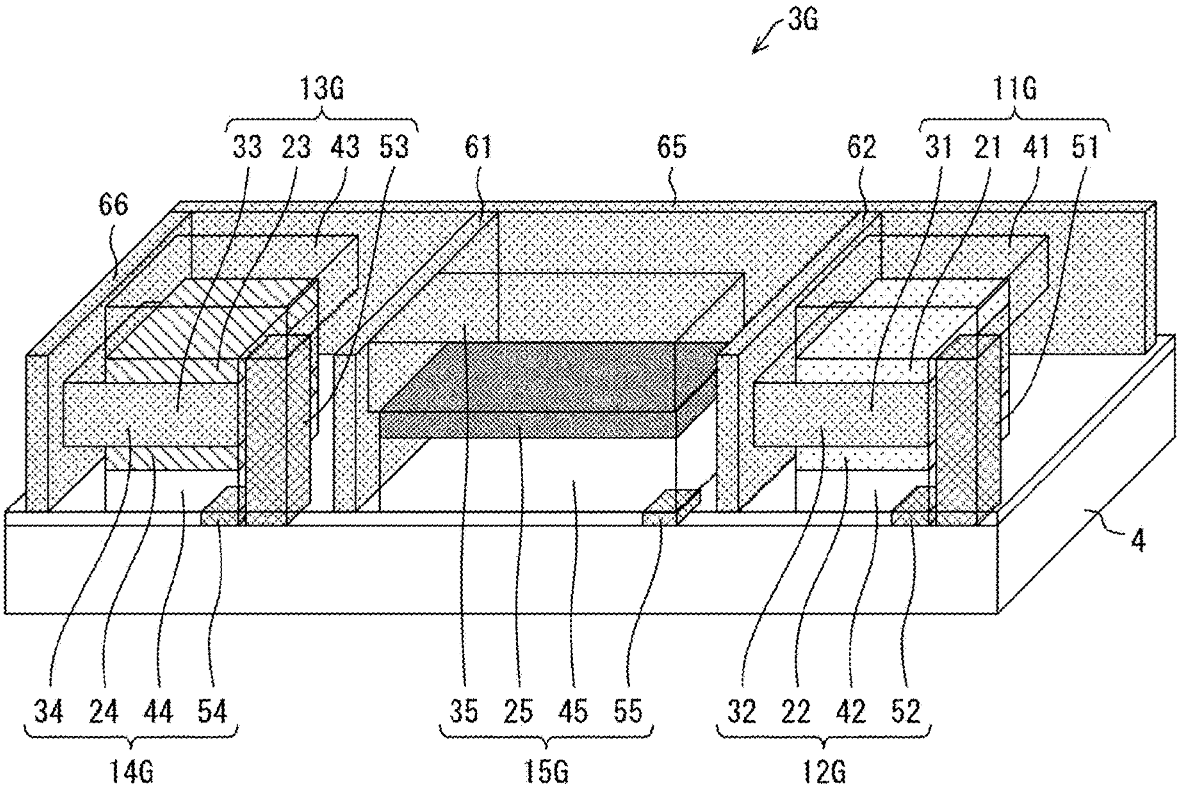
FIG. 22 is a bird's-eye view illustrating a configuration of an interior of a pixel according to the eighth embodiment of the disclosure.

FIG. 20 and FIG. 21 are diagrams each illustrating a configuration of each of pixels 3G provided in a light-emitting device 2G according to an eighth embodiment of the disclosure. FIG. 20 illustrates the configuration of each pixel 3G viewed from the side of a display surface 10 of the light-emitting device 2G. FIG. 21 is the diagram illustrating the configuration of each pixel 3G viewed from the side of a display surface 20 of the light-emitting device 2G. FIG. 22 is a bird's-eye view illustrating a configuration of an interior of the pixel 3G according to the eighth embodiment of the disclosure.

As illustrated in FIGS. 20 to 22, the light-emitting device 2G includes a plurality of pixels 3G disposed in a planar form. Since an adjacency relationship of each of the pixels 3G in the present embodiment is the same as the adjacency relationship of the pixels 3 in the first embodiment, detailed description thereof will be omitted. In the present embodiment, "adjacency of pixels 3G" means that two different pixels 3G share at least part of a boundary line defining the pixels 3G.

As illustrated in FIGS. 20 to 22, the pixel 3G includes a first R subpixel 11G, a second R subpixel 12G, a first G subpixel 13G, a second G subpixel 14G, and a B subpixel 15G. The light-emitting device 2G according to the present embodiment is different from the light-emitting devices according to the other embodiments in that the first R subpixel and the second R subpixel, which are provided in parallel on the same plane in the light-emitting devices according to the other embodiments, are layered in the present embodiment, and in that the first G subpixel and the second G subpixel are similarly layered in the present embodiment.

As illustrated in FIGS. 20 and 21, in the light-emitting device 2G, the first R subpixel 11G and the first G subpixel 13G are adjacent to the B subpixel 15G at the display surface 10 side. In the present embodiment, "adjacency of subpixels" means that two different subpixels share at least part of a boundary line defining the pixel 3G or any of the subpixels. As illustrated in FIGS. 20 and 21, in the light-emitting device 2G, the second R subpixel 12G and the second G subpixel 14G are adjacent to the B subpixel 15G at the display surface 20 side.

As illustrated in FIG. 22, the first R subpixel 11G includes a first R light-emitting layer 21, a reflective electrode 31, a transparent electrode 41, and a TFT 51. The second R subpixel 12G includes a second R light-emitting layer 22, a reflective electrode 32, a transparent electrode 42, and a TFT 52. In the pixel 3G, the second R subpixel 12G is disposed on a substrate 4, and the first R subpixel 11G is further disposed thereon. The reflective electrode 31 of the first R subpixel 11G and the reflective electrode 32 of the second R subpixel 12G are constituted as one common reflective electrode. Alternatively, the reflective electrodes 31 and 32 may be constituted as separate reflective electrodes layered on each other.

As illustrated in FIG. 22, different TFTs 51 and 52 are individually connected to the transparent electrode 41 of the first R subpixel 11G and the transparent electrode 42 of the second R subpixel 12G, respectively. Alternatively, the TFTs 51 and 52 may be constituted as one common TFT. In this case, one common TFT is connected to the transparent electrodes 41 and 42.

As illustrated in FIG. 22, the first G subpixel 13G includes a first G light-emitting layer 23, a reflective electrode 33, a transparent electrode 43, and a TFT 53. The second G subpixel 14G includes a second G light-emitting layer 24, a reflective electrode 34, a transparent electrode 44, and a TFT 54. In the pixel 3G, the second G subpixel 14G is disposed on the substrate 4, and the first G subpixel 13G is further disposed thereon. The reflective electrode 33 of the first G subpixel 13G and the reflective electrode 34 of the second G subpixel 14G are constituted as one common reflective electrode. Alternatively, the reflective electrodes 33 and 34 may be constituted as separate reflective electrodes layered on each other.

As illustrated in FIG. 22, different TFTs 53 and 54 are individually connected to the transparent electrode 43 of the first G subpixel 13G and the transparent electrode 44 of the second G subpixel 14G. Alternatively, the TFTs 53 and 54 may be constituted as one common TFT. In this case, one common TFT is connected to the transparent electrodes 43 and 44.

Since the configuration of the B subpixel 15G is the same as that of the B subpixel 15 according to the first embodiment, detailed description thereof will be omitted.

Main Effects

As illustrated in FIGS. 20 to 22, in the light-emitting device 2G, subpixels shielded from light by reflective electrodes are not present on any of the display surface 10 and the display surface 20. Accordingly, subpixels that are not displayed are not continuously disposed on any of the display surface 10 and the display surface 20. Thus, the light-emitting device 2G can display a smooth image or the like on both the display surface 10 and the display surface 20.

In the light-emitting device 2G, the first R subpixel 11G, the first G subpixel 13G, and the B subpixel 15G emit light at the display surface 10. Further, the second R subpixel 12G, the second G subpixel 14G, and the B subpixel 15G emit light at the display surface 20. Accordingly, similar to the light-emitting devices according to the other embodiments, the light-emitting device 2G can display the same information on both the display surface 10 and the display surface 20.

Area of Each Subpixel

As illustrated in FIG. 20 and FIG. 21, each of the first R subpixel 11G, the second R subpixel 12G, the first G subpixel 13G, and the second G subpixel 14G has a square shape. The shape of these subpixels is not necessarily limited to the square shape and may take another shape. The B subpixel 15G has a rectangular shape. The B subpixel 15G is not limited to the rectangular shape and may have another shape. In the B subpixel 15G, the length of the long side is twice the length of the short side. The length of the short side of the B subpixel 15G is equal to the length of each side of the first R subpixel 11G, the second R subpixel 12G, the first G subpixel 13G, and the second G subpixel 14G. Each of the first R subpixel 11G, the second R subpixel 12G, the first G subpixel 13G, and the second G subpixel 14G is adjacent to a short side portion of the B subpixel 15G.

In the present embodiment, the first R subpixel 11G, the second R subpixel 12G, the first G subpixel 13G, and the second G subpixel 14G have the same area in size. Meanwhile, the area of the B subpixel 15G is twice the area of each of the first R subpixel 11G, the second R subpixel 12G, the first G subpixel 13G, and the second G subpixel 14G. Accordingly, similar to the light-emitting device 2 illustrated in FIG. 3, the light-emitting device 2G can display information on both the display surface 10 and the display surface 20 by a normal current drive without losing the balance of each of colors of information.

The disclosure is not limited to the embodiments and aspects described above, and various modifications may be implemented within a range not departing from the scope of the claims. Embodiments obtained by appropriately combining technical approaches disclosed in each of the different embodiments also fall within the scope of the technology of the disclosure. Novel technical features may also be formed by combining the technical approaches stated in each of the embodiments.

REFERENCE SIGNS LIST

1 Display apparatus
2, 2A, 2B, 2C, 2D, 2E, 2F, 2G Light-emitting device
3, 3A, 3B, 3C, 3D, 3E, 3F, 3G Pixel
4 Substrate
10, 20 Display surface
11, 11C, 11D, 11F, 11G First R subpixel

12, 12C, 12D, 12F, 12G Second R subpixel
13, 13C, 13D, 13F, 13G First G subpixel
14, 14C, 14D, 14F, 14G Second G subpixel
15, 15C, 15D, 15F, 15G B subpixel
21, 81 First R light-emitting layer
22, 82 Second R light-emitting layer
23, 83 First G light-emitting layer
24, 84 Second G light-emitting layer
25, 25C B light-emitting layer
26 First Y light-emitting layer
27 Second Y light-emitting layer
31, 32, 33, 34, 36, 37 Reflective electrode
35, 41, 42, 43, 44, 45, 46, 47 Transparent electrode
51, 52, 53, 54, 55, 56, 57 TFT
61, 62, 63, 64, 65, 66 Bank
71, 72, 73, 74 Excitation layer

The invention claimed is:

1. A light-emitting device comprising a pixel and configured to display information on each of a first display surface and a second display surface on an opposite side to the first display surface, wherein the pixel is at least provided with:

a first subpixel that includes a first opaque layer disposed on the second display surface side and a first light-emitting layer disposed on the first display surface side relative to the first opaque layer and including a first quantum dot, and emits first color light having a longer wavelength than blue light at the first display surface side, a second subpixel that includes a second opaque layer disposed on the first display surface side and a second light-emitting layer disposed on the second display surface side relative to the second opaque layer and including a second quantum dot, and emits the first color light at the second display surface side, a third subpixel that includes a third opaque layer disposed on the second display surface side and a third light-emitting layer disposed on the first display surface side relative to the third opaque layer and including a third quantum dot, and emits second color light having a longer wavelength than blue light and being different from the first color light at the first display surface side, a fourth subpixel that includes a fourth opaque layer disposed on the first display surface side and a fourth light-emitting layer disposed on the second display surface side relative to the fourth opaque layer and including a fourth quantum dot, and emits the second color light at the first display surface side, and a fifth subpixel that includes a fifth light-emitting layer and emits the blue light at both the first display surface side and the second display surface side.

2. The light-emitting device according to claim 1, wherein the first opaque layer is a first opaque electrode, the first subpixel further includes a first transparent electrode disposed on the first display surface side relative to the first light-emitting layer, the first light-emitting layer is excited by current injection to emit the first color light, the second opaque layer is a second opaque electrode, the second subpixel further includes a second transparent electrode disposed on the second display surface side relative to the second light-emitting layer, the second light-emitting layer is excited by current injection to emit the first color light, the third opaque layer is a third opaque electrode, the third subpixel further includes a third transparent electrode disposed on the first display surface side relative to the third light-emitting layer, the third light-emitting layer is excited by current injection to emit the second color light, the fourth opaque layer is a fourth opaque electrode, the fourth subpixel further includes a fourth transparent electrode disposed on the second display surface side relative to the fourth light-emitting layer, the fourth light-emitting layer is excited by current injection to emit the second color light, and the fifth light-emitting layer is excited by current injection to emit the blue light.

3. The light-emitting device according to claim 1, wherein the first opaque layer is a first opaque electrode, the first subpixel further includes a first excitation layer that is disposed on the first display surface side relative to the first opaque electrode and is excited by current injection to emit excitation light having a shorter wavelength than the first color light and second color light, and a first transparent electrode disposed on the first display surface side relative to the first excitation layer, the first light-emitting layer is disposed on the first display surface side relative to the first transparent electrode, and is excited by the excitation light emitted from the first excitation layer to emit the first color light, the second opaque layer is a second opaque electrode, the second subpixel further includes a second excitation layer that is disposed on the second display surface side relative to the second opaque electrode and is excited by current injection to emit excitation light, and a second transparent electrode disposed on the second display surface side relative to the second excitation layer, the second light-emitting layer is disposed on the second display surface side relative to the second transparent electrode, and is excited by the excitation light emitted from the second excitation layer to emit the first color light, the third opaque layer is a third opaque electrode, the third subpixel further includes a third excitation layer that is disposed on the first display surface side relative to the third opaque electrode and is excited by current injection to emit excitation light, and a third transparent electrode disposed on the first display surface side relative to the third excitation layer, the third light-emitting layer is disposed on the first display surface side relative to the third transparent electrode, and is excited by the excitation light emitted from the third excitation layer to emit the second color light, the fourth opaque layer is a fourth opaque electrode, the fourth subpixel further includes a fourth excitation layer that is disposed on the second display surface side relative to the fourth opaque electrode and is excited by current injection to emit excitation light, and a fourth transparent electrode disposed on the second display surface side relative to the fourth excitation layer, the fourth light-emitting layer is disposed on the second display surface side relative to the fourth transparent electrode, and is excited by the excitation light emitted from the fourth excitation layer to emit the second color light, and the fifth light-emitting layer is excited by current injection to emit the blue light.

4. The light-emitting device according to claim 2, wherein the pixel includes banks for separating each of the subpixels that emit light of different colors from each other among the first to fifth subpixels, and at least part of the bank is constituted by an opaque electrode.

5. The light-emitting device according to claim 4, wherein the opaque electrode constituting the bank is connected to at least any of the first to fourth opaque electrodes.

6. The light-emitting device according to claim 2, wherein each of the first to fourth opaque electrodes is a reflective electrode.

7. The light-emitting device according to claim 1, wherein the first subpixel is adjacent to subpixels other than another first subpixel and the third subpixel, the second subpixel is adjacent to subpixels other than another second subpixel and the fourth subpixel, the third subpixel is adjacent to subpixels other than another third subpixel and the first subpixel, and the fourth subpixel is adjacent to subpixels other than another fourth subpixel and the second subpixel.

8. The light-emitting device according to claim 1, wherein the first subpixel and the second subpixel in a certain pixel are adjacent to each other, and the third subpixel and the fourth subpixel in the certain pixel are adjacent to each other.

9. The light-emitting device according to claim 1, wherein the first subpixel in the certain pixel is adjacent to at least any of the first subpixel and the second subpixel in another pixel adjacent to the certain pixel, and the second subpixel in the certain pixel is adjacent to at least any of the first subpixel and the second subpixel in another pixel adjacent to the certain pixel.

10. The light-emitting device according to claim 1, wherein the third subpixel in the certain pixel is adjacent to at least any of the third subpixel and the fourth subpixel in another pixel adjacent to the certain pixel, and the fourth subpixel in the certain pixel is adjacent to at least any of the third subpixel and the fourth subpixel in another pixel adjacent to the certain pixel.

11. The light-emitting device according to claim 9, wherein the first subpixel in the certain pixel is adjacent to the second subpixel in the first pixel adjacent to the certain pixel, and the first subpixel and the second subpixel in the second pixel adjacent to the certain pixel, the second subpixel in the certain pixel is adjacent to the second subpixel in the first pixel adjacent to the certain pixel, the first subpixel in the third pixel adjacent to the certain pixel, and the first subpixel in the fourth pixel adjacent to the certain pixel, the fourth subpixel in the certain pixel is adjacent to the third subpixel in the fourth pixel adjacent to the certain pixel, and the third subpixel and the fourth subpixel in the fifth pixel adjacent to the certain pixel, and the third subpixel in the certain pixel is adjacent to the fourth subpixel in the first pixel adjacent to the certain pixel, the third subpixel in the fifth pixel adjacent to the certain pixel, and the fourth subpixel in the sixth pixel adjacent to the certain pixel.

12. The light-emitting device according to claim 1, wherein an area of the fifth subpixel is twice or more an area of each of the first to fourth subpixels.

13. The light-emitting device according to claim 1, wherein the first color light is red light, and the second color light is green light.

14. The light-emitting device according to claim 1, wherein the pixel further includes a sixth subpixel that includes a fifth opaque layer disposed on the second display surface side and a sixth light-emitting layer disposed on the first display surface side relative to the fifth opaque layer and including a fifth quantum dot, and emits third color light having a longer wavelength than the blue light and being different from the first color light and second color light at the first display surface side, and a seventh subpixel that includes a sixth opaque layer disposed on the first display surface side and a seventh light-emitting layer disposed on the second display surface side relative to the sixth opaque layer and including a sixth quantum dot, and emits the third color light at the second display surface side.

15. The light-emitting device according to claim 14, wherein the fifth opaque layer is a fifth opaque electrode, the sixth subpixel further includes a fifth transparent electrode disposed on the first display surface side relative to the sixth light-emitting layer, the sixth light-emitting layer is excited by current injection to emit the third color light, the sixth opaque layer is a sixth opaque electrode, the seventh subpixel further includes a sixth transparent electrode disposed on the second display surface side relative to the seventh light-emitting layer, and the seventh light-emitting layer is excited by current injection to emit the third color light.

16. The light-emitting device according to claim 15, wherein the fifth opaque layer is the fifth opaque electrode, the sixth subpixel further includes a fifth excitation layer that is disposed on the first display surface side relative to the fifth opaque electrode and is excited by current injection to emit excitation light having a shorter wavelength than the first to third color light, and a sixth transparent electrode disposed on the first display surface side relative to the fifth excitation layer, the sixth light-emitting layer is disposed on the first display surface side relative to the sixth transparent electrode, and is excited by the excitation light emitted from the fifth excitation layer to emit the third color light, the sixth opaque layer is the sixth opaque electrode, the seventh subpixel further includes a sixth excitation layer that is disposed on the second display surface side relative to the sixth opaque electrode and is excited by current injection to emit the excitation light, and the sixth transparent electrode disposed on the second display surface side relative to the sixth excitation layer, and the seventh light-emitting layer is disposed on the second display surface side relative to the sixth transparent electrode, and is excited by the excitation light emitted from the sixth excitation layer to emit the third color light.

17. The light-emitting device according to claim 15, wherein the pixel includes banks for separating each of the subpixels that emit light of different colors from each other among the first to seventh subpixels, and at least part of the bank is constituted by an opaque electrode.

18. The light-emitting device according to claim 14, wherein the first subpixel is adjacent to subpixels other than another first subpixel, the third subpixel, and the sixth subpixel, the second subpixel is adjacent to subpixels other than another second subpixel, the fourth subpixel, and the seventh subpixel, the third subpixel is adjacent to subpixels other than another third subpixel, the first subpixel, and the sixth subpixel, the fourth subpixel is adjacent to subpixels other than another fourth subpixel, the second subpixel, and the seventh subpixel, the sixth subpixel is adjacent to subpixels other than another sixth subpixel, the first subpixel, and the third subpixel, and the seventh subpixel is adjacent to subpixels other than another seventh subpixel, the second subpixel, and the fourth subpixel.

19. The light-emitting device according to claim 14, wherein the first subpixel and the second subpixel in a certain pixel are adjacent to each other, the third subpixel and the fourth subpixel in the certain pixel are adjacent to each other, and the sixth subpixel and the seventh subpixel in the certain pixel are adjacent to each other.

20. A display apparatus comprising:

the light-emitting device according to claim 1.

* * * * *